(12) United States Patent
Castelli et al.

(10) Patent No.: US 6,956,507 B2
(45) Date of Patent: Oct. 18, 2005

(54) METHOD AND APPARATUS FOR MORPHING MEMORY COMPRESSED MACHINES

(75) Inventors: Vittorio Castelli, Croton on Hudson, NY (US); Peter Franaszek, Mt. Kisco, NY (US); Dan E. Poff, Mahopac, NY (US); Charles O. Schulz, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 311 days.

(21) Appl. No.: 10/317,590

(22) Filed: Dec. 12, 2002

(65) Prior Publication Data

US 2004/0117578 A1 Jun. 17, 2004

(51) Int. Cl.$^7$ .............................. G06F 12/00; H03M 7/30
(52) U.S. Cl. ................... 341/50; 711/170; 711/118; 711/154; 711/202; 711/203; 710/68; 708/203; 709/247; 707/101
(58) Field of Search ........................... 710/68; 708/203; 709/247; 707/101, 205; 345/555, 204; 382/239, 232; 370/477, 521; 341/50, 106; 711/170, 118, 154, 202, 203; 364/175.02

(56) References Cited

U.S. PATENT DOCUMENTS

| | | | | |
|---|---|---|---|---|
| 5,729,228 A | | 3/1998 | Franaszek et al. | 341/106 |
| 5,761,536 A | | 6/1998 | Franaszek | 710/68 |
| 5,802,553 A | * | 9/1998 | Robinson et al. | 711/103 |
| 5,812,817 A | * | 9/1998 | Hovis et al. | 711/173 |
| 5,864,859 A | | 1/1999 | Franaszek | 707/101 |
| 6,341,325 B2 | * | 1/2002 | Franaszek et al. | 711/3 |
| 6,349,372 B1 | * | 2/2002 | Benveniste et al. | 711/159 |
| 6,353,871 B1 | * | 3/2002 | Benveniste et al. | 711/3 |
| 6,539,460 B2 | * | 3/2003 | Castelli et al. | 711/154 |
| 6,779,088 B1 | * | 8/2004 | Benveniste et al. | 711/145 |
| 6,822,589 B1 | * | 11/2004 | Dye et al. | 341/51 |
| 2001/0044880 A1 | * | 11/2001 | Franaszek et al. | 711/117 |
| 2002/0099907 A1 | * | 7/2002 | Castelli et al. | 711/113 |
| 2002/0161932 A1 | * | 10/2002 | Herger et al. | 709/321 |
| 2003/0058873 A1 | * | 3/2003 | Geiger et al. | 370/401 |
| 2003/0225981 A1 | * | 12/2003 | Castelli et al. | 711/147 |
| 2004/0030813 A1 | * | 2/2004 | Benveniste et al. | 710/22 |

* cited by examiner

Primary Examiner—Hong Kim
(74) Attorney, Agent, or Firm—F. Chau & Associates, LLC

(57) ABSTRACT

A computer system having a main memory for storing data in a compressed format and a processor cache for storing decompressed data, a method for converting the data of said main memory from compressed to uncompressed state, comprising the steps of reducing used portions of said main memory to a target value; disabling a compressor used for compressing the uncompressed data; decompressing said compressed data of said main memory; moving said decompressed data to physical addresses equal to real addresses; and releasing the memory occupied by a compressed memory director and data structures used in the above steps.

28 Claims, 14 Drawing Sheets

METHOD AND APPARATUS FOR MORPHING MEMORY COMPRESSED MACHINES

BACKGROUND

1. Field of the Invention

The present invention relates to a processing system and method for converting contents in a memory from one format to another; more particularly, a system and method for converting compressed contents to uncompressed format (morphing) or vice versa while concurrently removing the operating system and regularity applications.

2. Discussion of Related Art

In a paged operating system, the virtual address space, namely, the collection of addresses addressable by a program, is divided into pages, with collections of contiguous virtual addresses having fixed lengths. Typically a page contains 4 Kb. The virtual address space of a program is in general much larger than the available physical memory. The operating system provides a set of functionalities supporting this feature, functionalities that are collectively referred to as virtual memory manager. To support virtual address spaces larger than the physical memory, virtual memory managers stores virtual pages both in memory and on tertiary store, usually hard disks. When a virtual page is accessed, and is not in main memory, it is read from disk (page-in operation). If there is no available physical space for the page being read from disk, another virtual page is written to disk (page-out operation) and its space is released. When a virtual page is read from disk, it is assigned a starting real address, namely, an address as seen from the processor. The real memory (the address space of the processor) is divided into a collection of contiguous and pairwise disjoint real address ranges, having the same size as a logical page. These are called page frames. Hence, when a logical page is read from memory, it is stored within a page frame. The translation between logical and real pages relies on a directory structure divided into pages called page tables. Each logical page has a unique entry in a page table, called page table entry, which contains the starting real address of the page frame containing the page, or the position on disk, if the logical page is on tertiary store. Free page frames are managed using a separate data structure.

The set of page frames used by processes (including those of the OS) is managed by appropriate modules of the operating system. Most operating systems provide virtual memory management, namely, offer each process an address space which is commonly significantly larger than the available physical memory. To accomplish this, the operating system maintains only a fraction of the pages of each process in memory, and stores the others on mass storage, such as hard disks. Hence a physical page, which is a set of contiguous physical addresses, can contain a virtual page of a process, or can be temporarily unused. A physical page is commonly called a page frame. When a process issues an operation on a page which is not in memory, the page is copied from disk into an unused page frame (similarly, if the page is a new one, that is, it is not stored on disk, an unused page frame is allocated to it). A page frame can be unused for at least three reasons: (1) because it has never been used since the machine was last started; (2) because the process that last used it has terminated; and (3) because the operating system frees it. In the last case, the operating system is also responsible to ensure that a copy of the content of the page frame to be freed is present on disk. Usually, mechanisms exist to detect if the content of the page frame has been modified since it has been allocated or copied from disk. If the page frame is unchanged, there is no need to copy it back. If the page frame content has been modified, it must be copied to disk, otherwise there is no need to do so.

An emerging development in computer organization is the use of data compression in the main memory of a computer system. The data in the main memory is stored in a compressed format.

FIG. 1 depicts an exemplary processing system having compressed contents in memory. In FIG. 1, a central processing unit (CPU) 102 reads data to and writes data from a cache 104. Cache misses and stores results it reads from and writes to a compressed main memory 10 by means of a compression controller 106. The real memory, namely, the set of processor addresses that correspond to data stored in memory, is typically divided into a number of pairwise disjoint segments corresponding to a fixed number of contiguous processor addresses. Pairwise disjoint means that each real address belongs to one and only one such segments. These segments are referred to as memory lines. Memory lines are the unit of compression. A memory line stored in the compressed memory is compressed and stored in a variable number of memory locations, which depends on how well its content compresses.

U.S. Pat. Nos. 5,761,536 and 5,729,228 disclose computer systems where the contents of main memory are compressed.

Referring again to FIG. 1, the compressed memory is divided into two parts: a data portion 108 and a directory 107. The data portion is divided into pairwise disjoint sectors, which are fixed-size intervals of physical memory locations. For example, a sector may consist of 256 physical bytes having contiguous physical addresses. The content of a compressed memory line is stored in the minimum possible number of physical sectors. The physical sectors containing a compressed line need not have contiguous physical addresses, and can be located anywhere within the data portion of the compressed main memory. The translation between the real address of byte and the address of the physical sector containing it is performed via the directory 107.

FIG. 2 shows further details to better understand the operation of the compressed memory. The processor cache 240 contains uncompressed cache lines 241 and a cache directory 242, which stores the real address of each cache line. In the following discussion, an assumption is made that a cache line has the same size as a memory line (the unit of compression). Upon a cache miss, the cache requests the corresponding line from memory, by providing real address 270 that caused the miss. The real address is divided into two parts: the $\log_2$(line length) least significant bits are the offset of the address within the line, where $\log_2(\ )$ is the logarithm in base 2. The other bits are used as index in the compressed memory directory 220, which contains a line entry for each line in the supported real address range. Address A1 (271) corresponds to line entry 1 (221), address A2 (272) corresponds to line entry 2 (222), address A3 (273) corresponds to line entry 3 (513) and address A4 (274) corresponds to line entry 4 (514), and so on. Different addresses are used in the example to show different ways of storing compressed data in the compressed main memory. In this illustration, the line having address A1 compresses very well (for example, a line consisting of all zeros). Such line is stored entirely in the directory entry 221, and does not require memory sectors. The line at address A2 compresses less well, and requires two memory sectors 231 and 232, which are stored in the data section 230. Line entry 222 contains pointers to the memory sectors 231 and 232. Note that the last part of memory sector 232 is unused. The line having address A3 requires 3 memory sectors, 233, 234 and 235. The space left unused in sector 235 is large enough to store part of the compressed line having real address A4, which in turn uses sector 236 and part of 235. The lines at addresses A4 and A3 are called roommates. The compressor is used when so called dirty lines (e.g., lines previously used) in the cache are written back into memory. Upon a cache writeback, a dirty line is compressed. If it fits in the same amount of memory it used before the writeback, it is stored in place. Otherwise, its is written in the appropriate number of sectors. If the number of required sectors decreases, the unused sectors are added to a free-sector list. If the number of required sectors increases, they are retrieved from the free-sector list.

FIG. 3 shows possible organizations of the entries in the compression directory 220. The figure illustrates three different line organizations. Entry 1 (306) contains a set of flags (301), and the addresses of 4 sectors. If the line size is 1024 bytes, and the memory sector size is 256, the line requires at most 4 sectors. Entry 2 (307) contains a set of flags, the address of the first sector used by the line, the beginning of the compressed line, and the address of the last sector used by the line. If the line requires more than 2 memory sectors, the sectors are connected by a linked list of pointers (namely, each memory sector contains the address of the subsequent one). Entry 3 contains a set of flags, and a highly compressed line, which compresses to 120 bits or less. The flags in the example are flag 302, indicating whether the line is stored in compressed format or uncompressed, flag 303 indicating if the line is highly compressible and is stored entirely in the directory entry, flag 304 (2 bits) indicating how many sectors the line uses, flag 305 (4 bits), containing the fragment information), namely what portion of the last used sector is occupied by the line (this information is used for roommating).

The maximum compression ratio achievable in a system with memory compression that relies on the described compressed-memory organization depends on the size of the directory: the maximum number of real addresses is equal to the number of directory entries in the directory. Limiting the size of the directory to yield, say, a 2:1 compression is suboptimal for most computer applications, where higher compression ratios are usually observed. On the other hand, a large directory occupies a substantial amount of physical memory, which can impair the system performance if the content of memory happens to be poorly compressible. The memory compression schemes described in the art have a directory size which is fixed when the machine is booted, and cannot be changed while the machine operates.

The cost of compressing and decompressing (i.e., the latency) is partially hidden by the cache. A large cache almost entirely hides these latencies for most typical workloads. However, for non-cache-friendly workloads, that do not have a strong locality of memory references, the cache cannot hide the latencies, and the performance of a system with memory compression is significantly worse than that of an analogous system without memory compression. If the characteristics of the workload are known a-priori, the memory compression scheme described in the art allow the computer system to be started and operate in uncompressed mode (as a standard computer, where real addresses correspond to physical address). However, if the machine is started in uncompressed mode, it cannot be converted back to a compressed mode without restarting it, and vice versa.

When memory compression is used in a paged memory system, the number of page frames that can be used by processes varies dynamically. The page frames that can be used by processes are referred to herein as usable page frames. If the compressibility of the data increases, the number of usable page frames can be increased. Similarly, if the compressibility drops, more page frames can be made unavailable.

In a computer system where the content of main memory is kept in compressed format, the translation between a real address as produced by the processor and the physical address of the memory cells containing the compressed data is performed using a directory, referred to herein as compressed-translation table (CTT). Data is compressed and stored into memory upon cache write-backs. Upon cache misses, the content of memory is decompressed. The latency of the decompression process are hidden by using a large cache memory.

When the memory contains poorly compressible data, the number of different page frames in memory (the size of the real memory) can be smaller than the number of physical pages, and the performance of the compressed-memory system might be lower than that of a traditional system having the same amount of physical memory, due to an increase in page faults. When the workload is cache-unfriendly, namely, when it causes a large number of cache misses, the cache does not hide the decompression latency quite as well, and the performance of the system supporting memory compression suffers. If cache-unfriendly workloads are run for long periods of time, the reduced performance of the system becomes visible to the user.

The above examples of cases where running the system in traditional mode with the content of memory uncompressed and without the additional cost of real-to-physical translation can be beneficial. The hardware of systems supporting memory compression therefore can also operate in traditional uncompressed mode. Typically, the decision of whether to run the system in compressed-memory mode or in traditional mode is based on knowledge of the intended workload or of the data. Once the decision is taken, the system runs in compressed-memory or uncompressed-memory mode until the next time it is rebooted: the mode of operation cannot be changed while the system is computing. A need therefore exists for a system and method for switching the mode of operation from compressed-memory to uncompressed-memory or vice versa without CTT, does not require either rebooting the system or halting operation of applications, or capable of dynamically changing the size of the compressed-memory directory.

SUMMARY OF THE INVENTION

A computer system having a main memory for storing data in a compressed format and a processor cache for storing decompressed data, a method for converting the data of said main memory from compressed to uncompressed state, comprising the steps of reducing used portions of said main memory to a target value; disabling a compressor used for compressing the uncompressed data; decompressing said compressed data of said main memory; moving said decompressed data to physical addresses equal to real addresses; and releasing the memory occupied by a compressed memory director and data structures used in the above steps.

A computer system in which main memory contents can be maintained in a compressed format and in uncompressed format, a method for converting the operating mode from uncompressed mode to compressed mode, not requiring stopping and restarting said computer system, comprising the steps of selecting a size for the compressed memory directory; removing the content of the portion of said main memory selected to contain said compressed memory directory; initializing said compressed memory directory, and enabling compressed-main memory mode.

A computer system having a main memory for maintaining contents in a compressed format and a compressed memory directory, a method for increasing the size of the compressed-memory directory while not requiring stopping and restarting said computer system, comprising the steps of selecting a new size for the compressed memory directory; removing the content of the portion of said main memory selected to contain the additional portion of said compressed memory directory; and initializing the expanded portion of said compressed-memory directory.

A device for storing codes executable by a processor in a computer system for performing a method for decreasing the size of compressed-memory director of a compressed contents in a main memory in the computer system, the method comprising the steps of selecting a new size for the compressed memory directory to contain entries for M page frames; reducing the number of page frames to said value M; and changing the address of page frames having addresses outside the range addressable by said compressed-memory directory with said selected new size, to address within said addressable range.

A computer system having a main memory for storing data in a compressed format and a processor cache for strong decompressed data, a method for converting the data of said main memory from compressed to uncompressed state, comprising the steps of reducing used portions of said main memory to a target value; disabling a compressor used for compressing the uncompressed data; decompressing said compressed data of said main memory; moving said decompressed data to physical addresses equal to real addresses; and releasing the memory occupied by a compressed memory director and data structures used in steps a. to d.

DETAILED DESCRIPTION OF PREFERRED EMBODIMENTS

One aspect of preferred embodiments of the present invention dynamically changes the size of the real space of a computer supporting compressed-memory via a contiguous directory.

Figure 1:
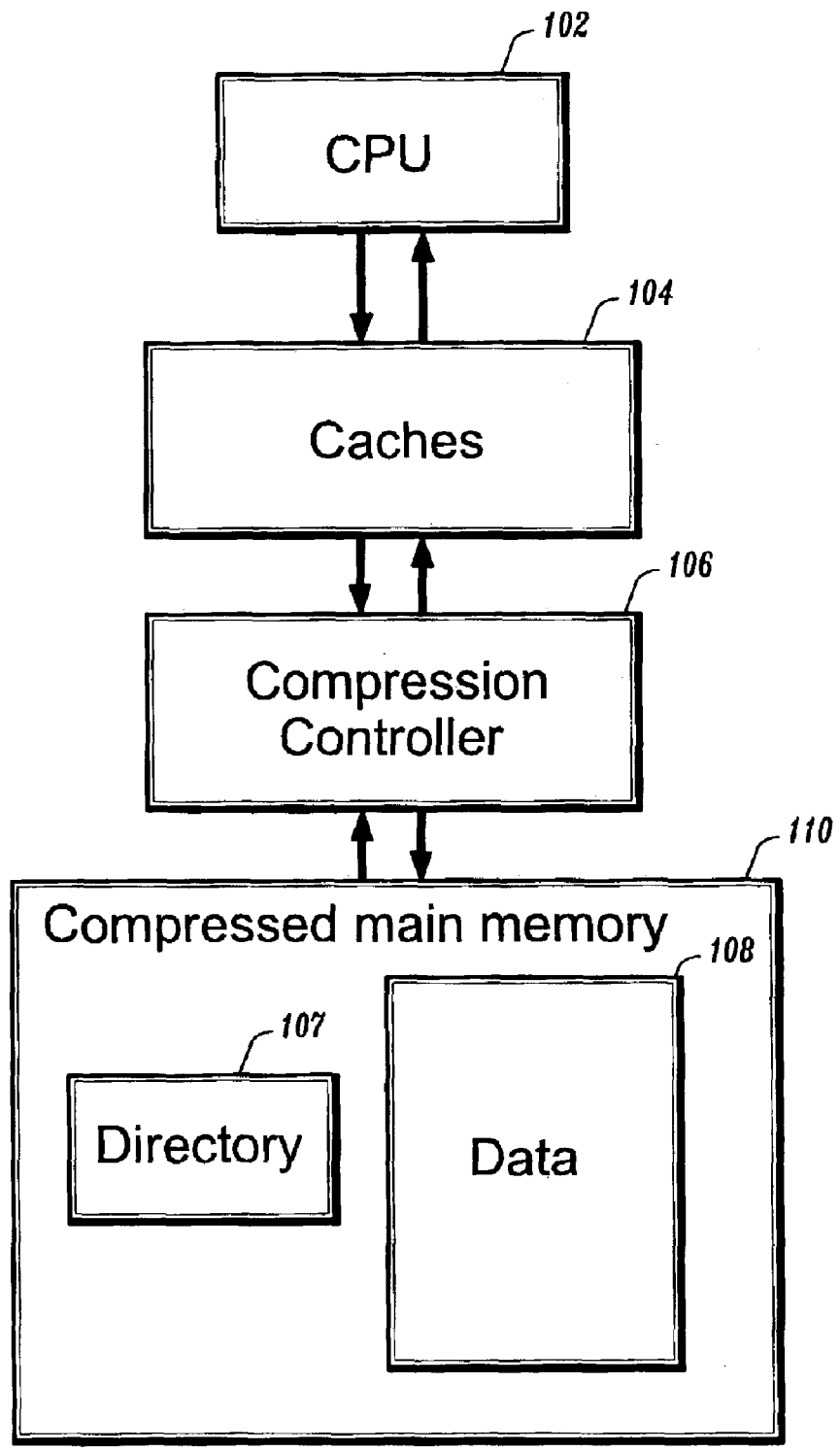
FIG. 1 shows a conventional computer system having compressed main memory.
Figure 2:
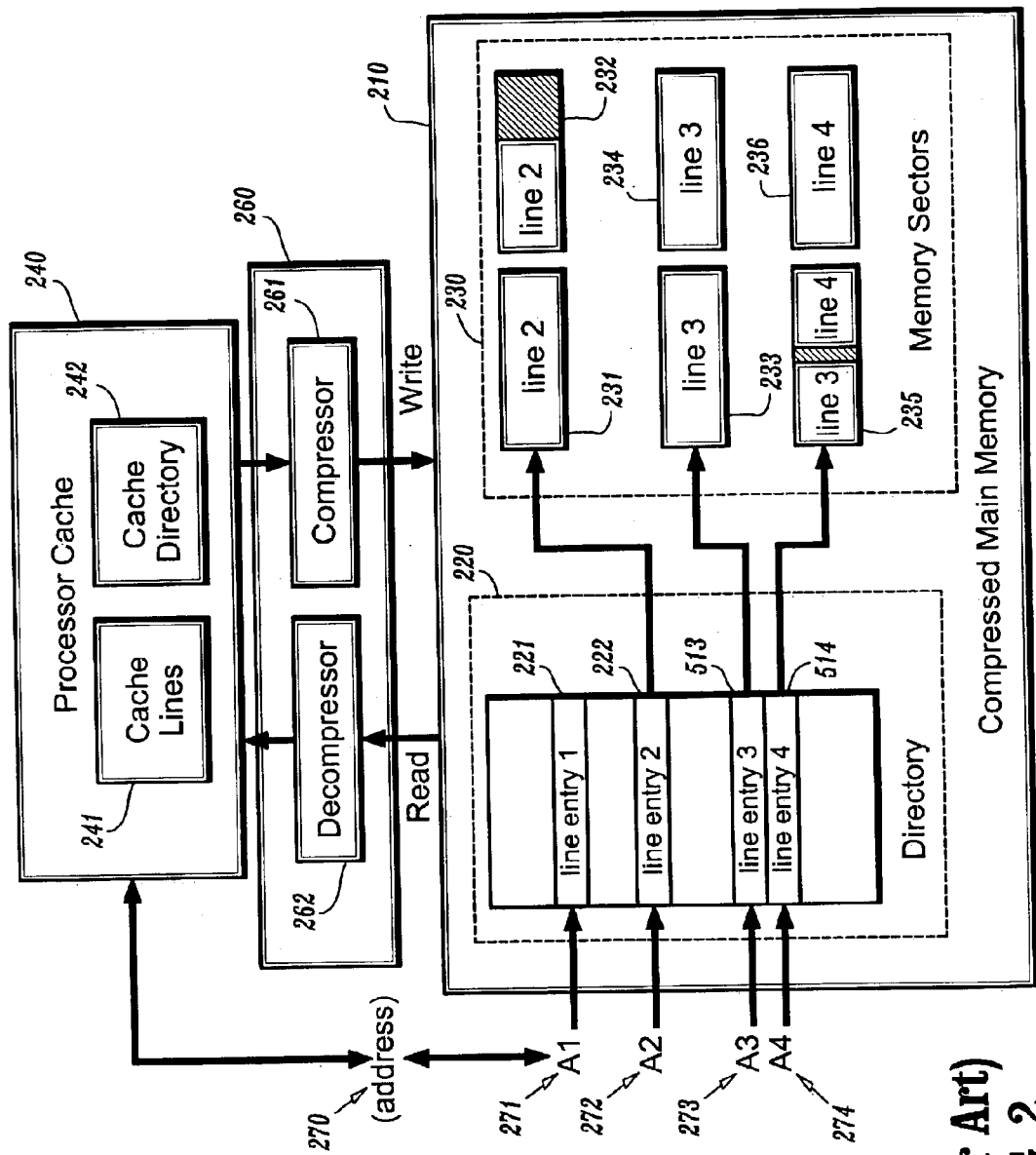
FIG. 2 shows a memory structure of the computer system of FIG. 1.
Figure 3:
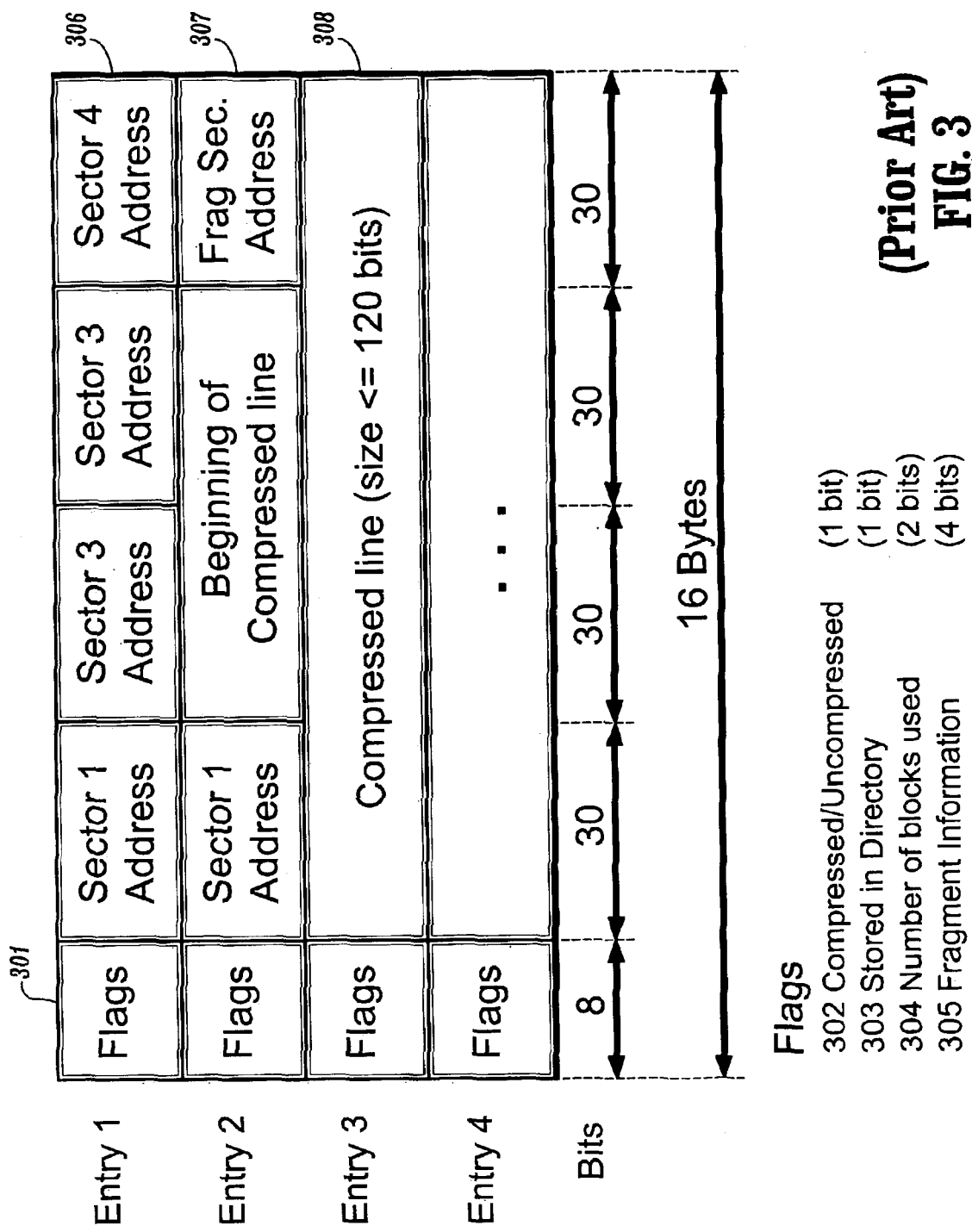
FIG. 3 shows a structure of the entry of a memory directory in the computer system of FIG. 1.
Figure 4:
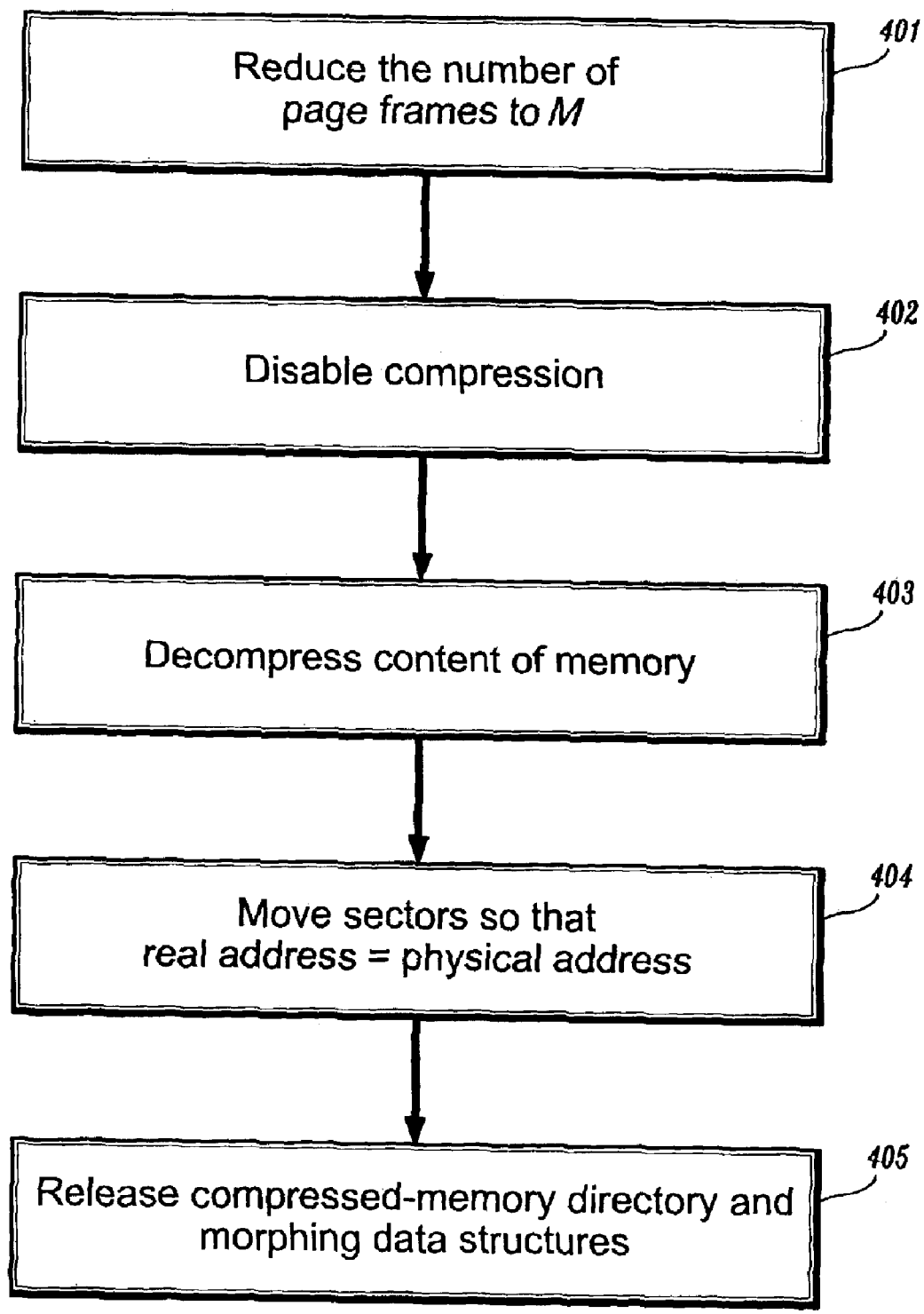
FIG. 4 shows a method for morphing the content of main memory from compressed to decompressed state without interrupting the normal operation of a computer system according to an embodiment of the present invention.

FIG. 4 shows an exemplary flowchart of a method for morphing from compressed-memory operation to uncompressed-memory operation according to an embodiment of the present invention. The number of page frames that can be used by processes, hereinafter referred to as usable page frames is reduced to a value M, which depends on the specific embodiment of the invention (step 401). M is smaller than the maximum number of page frames that could be contained in the physical memory. Step 402 disables the compressor which compresses memory. After step 402, each logical page paged-in from disk is stored in main memory in uncompressed form, and occupies the maximum number of memory sectors, as described for FIG. 3. Similarly, each memory line written back from cache to memory is stored uncompressed. In step 403, the entire content of memory is decompressed; preferably, decompressing the entire content of memory is accomplished by reading each memory line into cache and forcing a writeback. When the entire content of memory is decompressed, and each memory line is stored in the maximum number of sectors, step 404 copies the memory sectors to physical addresses equal to their real addresses. Step 404 terminates when all the sectors in the compressed memory 110 are stored uncompressed at physical addresses equal to their real addresses. Step 405 releases the memory occupied by the compressed memory directory and by the data structures used by the morphing module, which is returned to the operating system as unused page frames.

Figure 5:
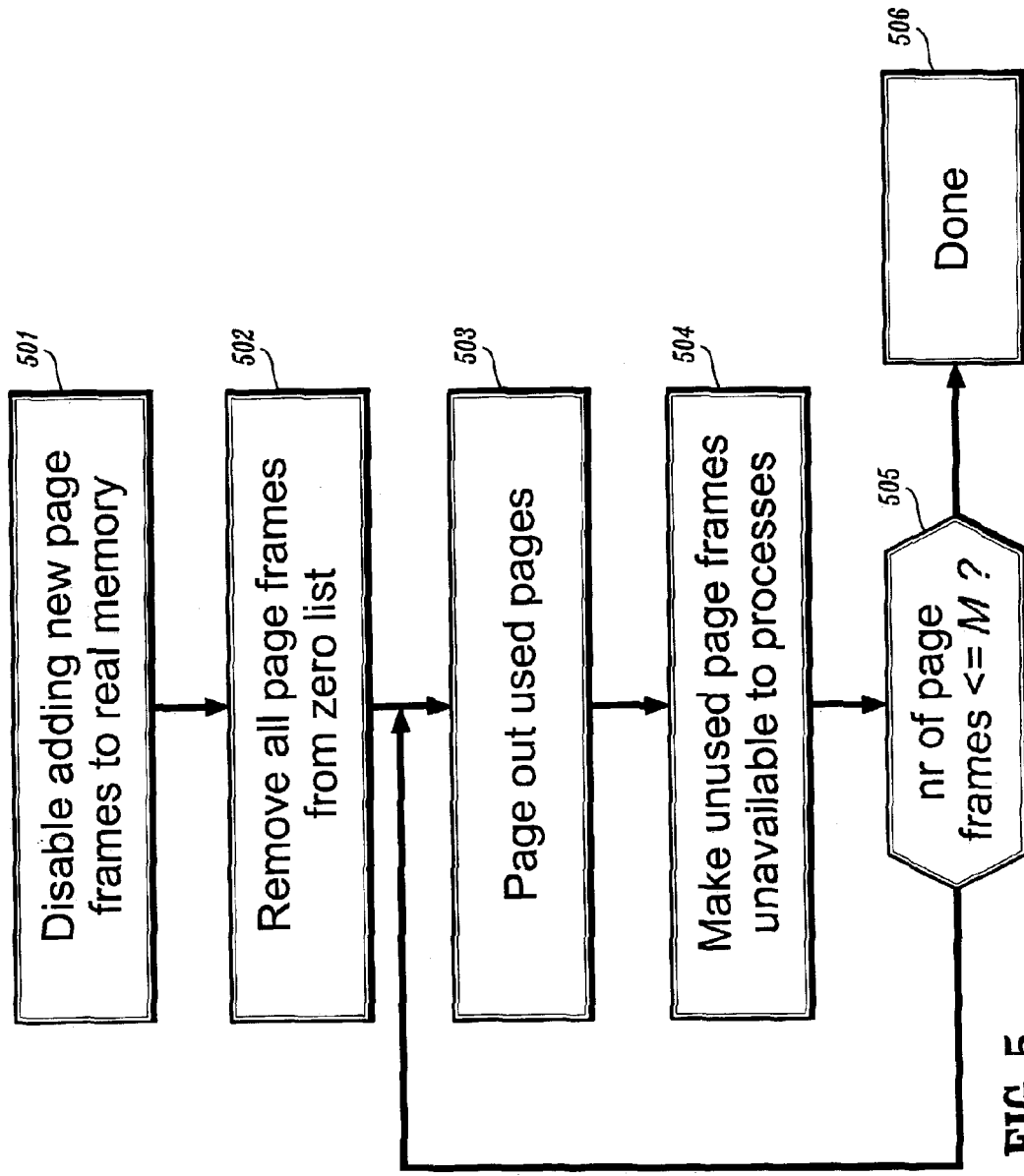
FIG. 5 shows a method for reducing the used portion of compressed main memory to a desired value.

FIG. 5 shows a preferred process of reducing the number of page frames to a desired value M of step 401. Step 501 prevents increasing the number of usable page frames: the compressed-memory mechanism for making page frames usable if the compressibility improves (for instance, if the number of memory sectors on the free-sector list exceeds a threshold) is disabled. In an alternate embodiment, a control policy is used that does not prevent increasing the number of usable page frames, but limits the rate at which page frames are made usable, so that the overall effect of the procedure illustrated by FIG. 5 is to actually reduce the number of usable page frames. The subsequent steps of FIG. 5 may have the overall effect of increasing the number of sectors on the free-sector list. In a preferred embodiment, where morphing is triggered by a cache-unfriendly workload, step 501 also temporarily disables page-ins on user processes unless the number of sectors on the free-sector list is above an appropriate threshold. In this embodiment, page-ins are re-enabled at step 506. In other embodiments, page-ins are not disabled.

The operating system uses appropriate data structures, typically one or more lists, to keep track of usable page frames that are not used by any process. In particular, there is a data structure keeping track of available usable page frame (a usable page frame could be unavailable, for example, if it is not used by any process, its content has been modified but has not been written to disk yet). In some operating systems, this structure is called zero page list.

Step 502 removes all usable page frames from the zero page list. In a preferred embodiment, these page frames are not associated with memory sectors: as described in FIG. 3, highly compressible memory lines are stored entirely in the corresponding CTT-entry. Removing all page frames from the zero page list has the effect of reducing the real memory. Steps 503 and 504 are repeatedly executed until the number of usable page frames in memory is reduced to or below the threshold M. Recall that a usable page frame is a page frame used by a process or unused and kept by the operating system in a data structure that makes it available to processes. One skilled in the art can readily appreciate how the definition of usable page frames can be easily adapted to paged operating systems that use different data structures for page-frame management. Step 503 takes pages used by processes, writes modified pages to disk, and adds them to the data strictures used to keep track of unused pages. This process is similar to the process of pruning the working set of processes in operating systems such as Windows 2000. In a preferred embodiment the operations required by step 503 are performed by invoking the appropriate operating system modules. Step 504 takes unused page frames and makes then unavailable to processes. Step 503 and 504 can be executed concurrently.

Step 505 controls the operations of Step 503 and 504, and terminates their execution when the number of page frames equals the desired value M, or falls below M. In a prefer-ed embodiment, the value of M is selected using the following equation $$M <= \text{(physical memory size} - \text{CTT size} - \text{morphing structure size)} / \text{(page size)}$$

The number M must be large enough to contain the non-pageable code and data structures stored in memory. Note that all the code and data necessary for the operations of the computer system will be contained in these M pages, except for the data used by the morphing process, which resides outside said M pages.

The method taught of FIG. 5 does not prevent page-ins. For example, if the number of memory sectors in the free-sector list is large enough, the appropriate operating system modules can reuse page frames on the standby and free page list, and add them to the working set of their original process. To ensure that the method of FIG. 5 terminates, the invoked operating system modules must have sufficiently high priority, the value of which can be modified during the morphing operation to remove page frames from memory at a desired rate.

Figure 6:
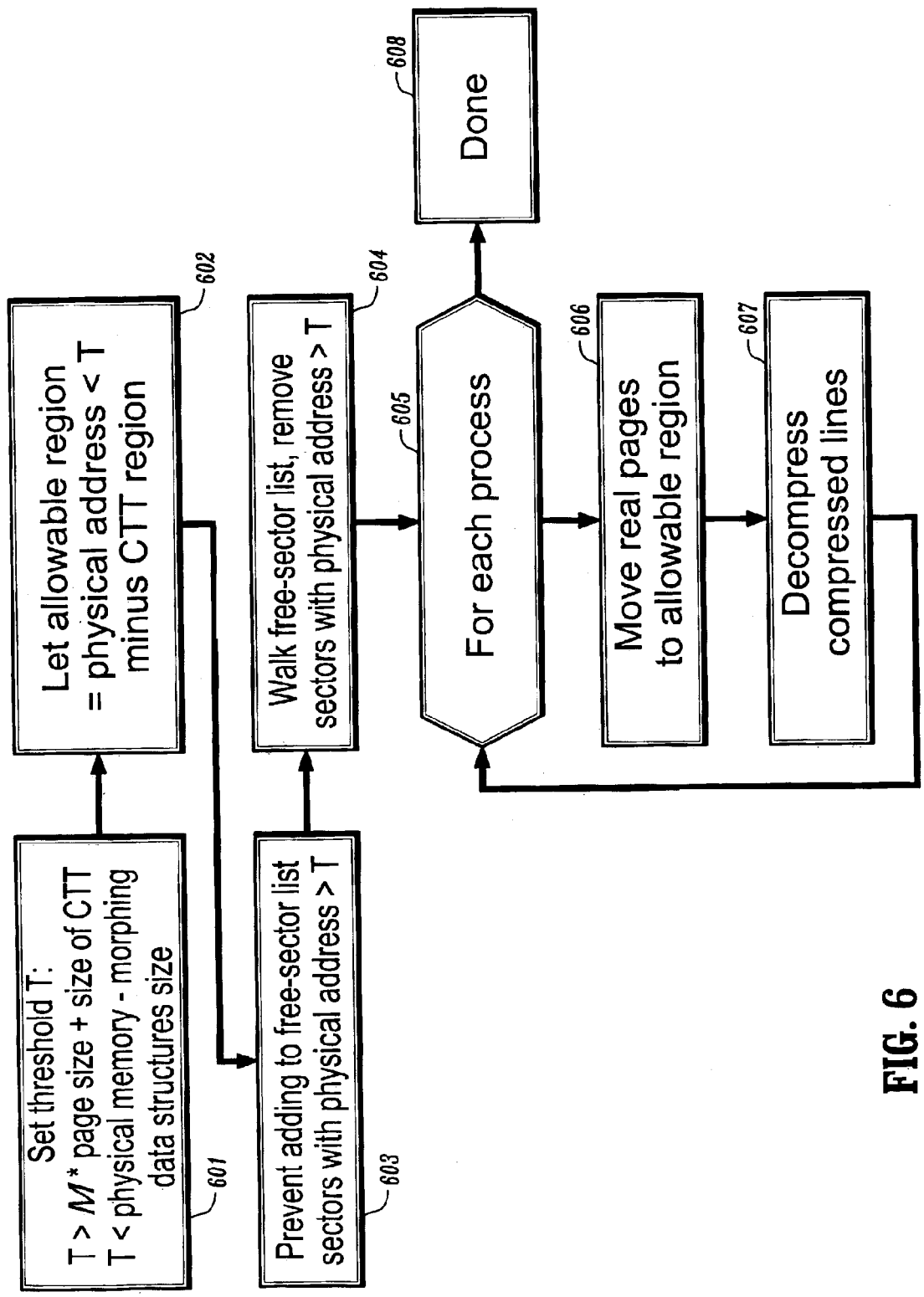
FIG. 6 shows a method for changing the real addresses of pages used by processes to allowable regions and to decompress the content of the pages.

FIG. 6 shows a method of decompressing the content of memory 403 according to a preferred embodiment of this invention. In step 601 a threshold T is selected, which satisfies 2 constraints:

(1) The threshold T is larger than the size of the CTT in bytes plus M times the size of a physical page, and (2) the threshold T is smaller than the size of the physical memory minus the size of the data structures used during morphing.

Step 602 defines an allowable region of the real memory space, as the set of real addresses below the threshold T defined in step 601, minus the set of physical addresses occupied by the CTT and by other data structures used by the memory compression management system. This allowable regions has two main purposes: in real space, it defines the set of real addresses that can be active at the time when morphing terminates; in physical space, it defines the set of physical addresses that are in use right after morphing terminates. Hence, two goals are accomplished: all active pages with real addresses outside the allowable region are removed from real space; and all memory sectors with physical address outside the allowable region and that are in use are reclaimed.

Figure 13:
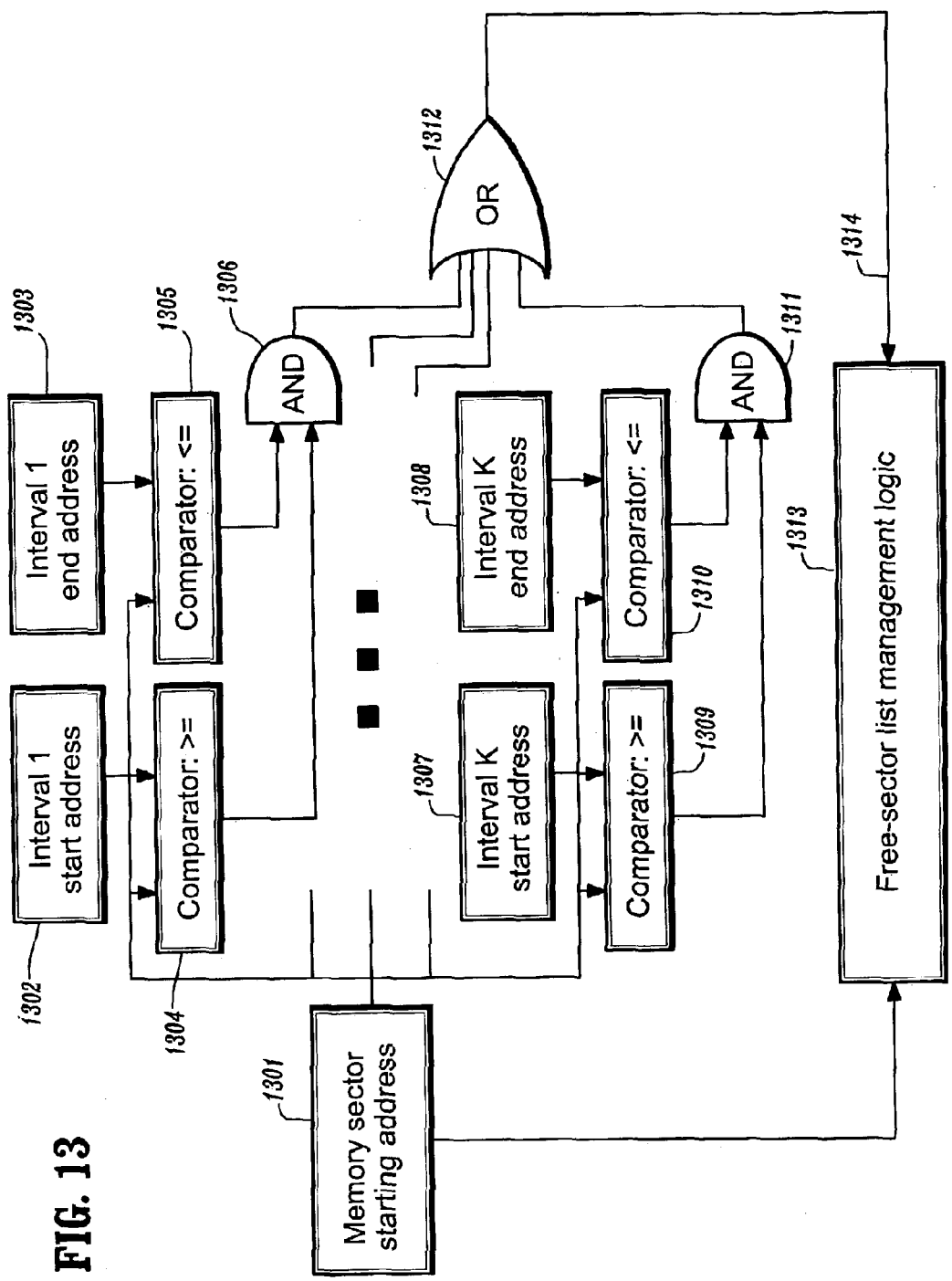
FIG. 13 shows an implementation of an embodiment of the present invention.

Steps 603 and 604 deal with the free-sector list maintained by the memory-compression system. Step 603 prevents adding free-sectors that have physical addresses outside the allowable region to the free-sector list. In one way to accomplish this, the mechanism controlling the management of the free-sector list is modified appropriately. A preferred embodiment of such management control is shown in FIG. 13, to be described below. When a free sector that lies outside the allowed region is presented to the free-sector list manager, the manager does not add it to the list, and forgets its address. Hence, said sector is neither used by a page frame, nor is on the free-sector list. No pointer is maintained that contains its address, and therefore it is henceforth invisible, hence unusable, by the compressed-memory management system. Note that this is not a problem: eventually all memory-sectors residing outside the allowable region will be released; the morphing mechanism accesses directly (i.e., using physical addresses) memory locations outside the allowable region, and therefore there is no need to maintain pointers to the released sectors.

Figure 7:
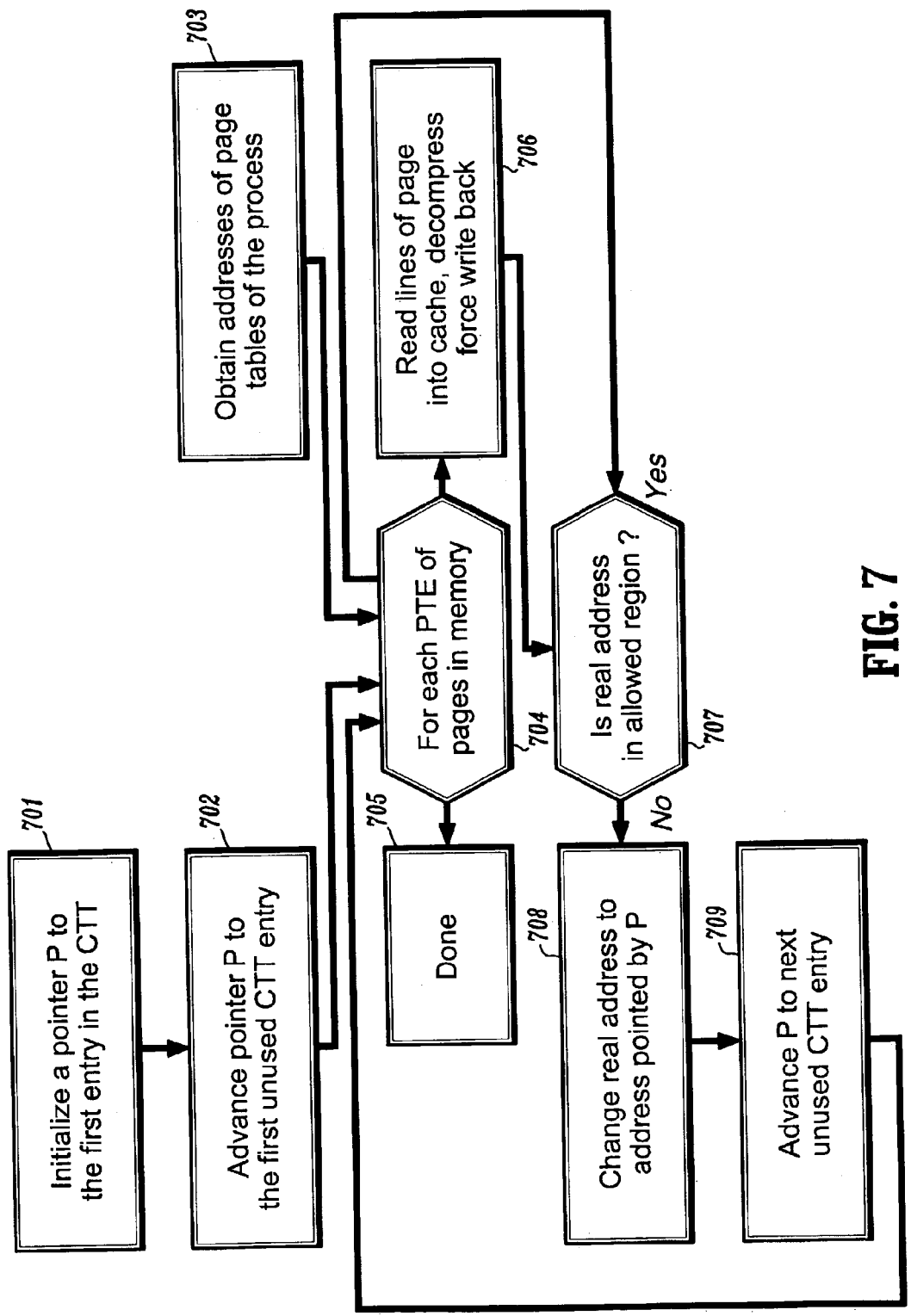
FIG. 7 shows a method for changing the real addresses of pages used by processes to allowable regions and to decompress the content of said pages.

Step 604 then analyzes the free-sector list maintained by the memory compression subsystem. It examines all its memory sectors and removes those with physical addresses outside the allowable region. As in step 603, these sectors are simply released, and no pointer to them is maintained by the memory-compression manager. When step 604 terminates, step 605 analyzes all the processes in the system. In a preferred embodiment, the operating system maintains a unique process descriptor per each process, namely, a data structure containing the information relevant to said process. In this preferred embodiment, step 605 obtains a pointer to each process descriptor and uses said process descriptors to analyze each process. Step 605 controls the execution of steps 606 and 607, and terminates the operation described in FIG. 6 when all the processes have been analyzed (step 608). In step 606, the page frames associated with the process being analyzed are inspected, and page frames falling outside the allowable region are moved to the allowable region. In step 607, all the lines of the resident pages of the process are decompressed by reading them in cache and forcing a write-back. FIG. 7 illustrate steps 606 and 607 according to a preferred embodiment of the present invention. Steps 701 and 702 are preferably executed once. They can be executed before step 601, between step 601 and 602, between step 603 and 604, or after step 604 but before step 704. In step 704 a pointer P is initialized to the first entry in the CTT. In a preferred embodiment, the pointer P is physically stored in a special-purpose register within the memory controller. In step 702, the pointer is advanced until the first unused CTT entry is found. In a preferred embodiment, the information on whether a CTT entry is used or not is contained in the CTT entry itself. In another preferred embodiment, a list is maintained of unused CTT entries, and in this case step 701 initializes a pointer to the beginning of the list of unused CTT entries, and step 702 advances the pointer until the first unused CTT entry having real address within the allowable region defined in step 602 is encountered. Steps 703 to 709 are detailed explanations of steps 606 and 607 in the context of the current preferred embodiment. Step 704 analyzes each Page Table Entry (PTE) associated with the process being analyzed, and terminates when all the PTES of the process have been analyzed (step 705). If the PTE translates a virtual pages to a real page in memory, the below described steps are executed. Step 706 decompresses each line of the page. In a preferred embodiment, where memory lines are decompressed upon cache-misses, and stored entirely into cache, step 706 reads each line of the page into cache, and forces a write-back hence decompressing the content of the line (since the compressor was disabled in step 402). In a preferred embodiment, the forced write-back is assisted by hardware: the cache-controller is augmented with appropriate circuitry that would force the write-back (for example, hardware that would set on demand the modified-flag). In a different embodiment, step 706 is accomplished by software: the memory line is read into cache by a program, which also loads one of the bytes of the line, say the first, into a register of the processor, and writes back the byte into the same position within the cache line. With this method, the cache controller detects a write to the cache line, marks the line as modified, and therefore, when the line is evicted from cache, it is written back. Step 707 checks the real address of the page translated by the PTE. If the real address is in the allowed region, the next PTE is analyzed by step 704. Otherwise step 708 copies the content of the CTT entry corresponding to the real page whose address is in the PTE to the unused CTT entry pointed by P, and changes the real address in the PTE to the real page translated by the CTT entry pointed by P. There is no need to add the old CTT-entry to the unused entry list, since it will not be reused. Step 709 advances the pointer P to the next unused CTT entry.

In a preferred embodiment where the CTT-entries contain information on whether they are used or unused, the pointer P is simply incremented until an unused CTT-entry is found. In the preferred embodiment where the unused CTT entries belong to a list, the pointer P is advanced within the list, until a CTT entry is found which corresponds to a real page having address within the allowable region. It would be apparent to one skilled in the art that, depending on the specific operating system, further steps might need to be taken to prevent the operating system to allocate new page frames in the unallowed region. In operating systems like Windows NT and Windows 2000 this is not necessary, because all page frames not on the zero- or free-page list are still pointed to by the CTT entry of the process to which they belonged, or by a data structure associated with the process to which they belonged. In a preferred embodiment, where the operating system maintains such data structure, said data structure would be analyzed using the same method described in FIG. 7. In a preferred embodiment, the page frames on the zero list are analyzed before beginning step 703, and removed from the zero list if their address is within the non-allowed region. In another embodiment, they are analyzed and modified using steps 707, 708 and 709.

According to still another embodiment of the present invention, the CTT can be positioned in a generic position within the physical memory, and can be potentially subdivided into a collection of contiguous intervals. The definition of the allowable region is formally identical, and the appropriate changes to the tests determining whether physical sectors and real addresses of page frames fall within the allowable region could be easily made by one skilled in the art.

Figure 8:
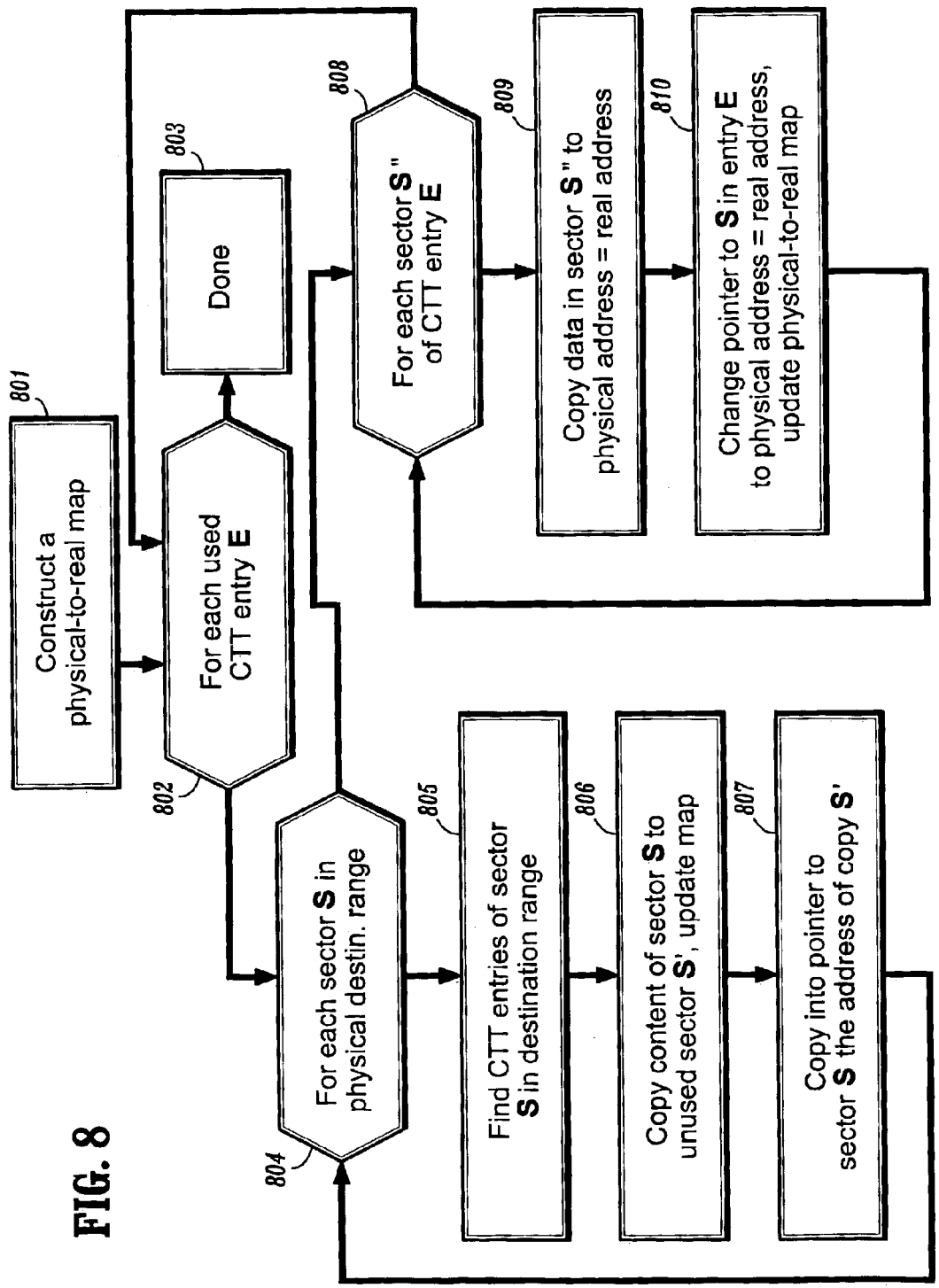
FIG. 8 shows a method for moving the content of memory so that real addresses equal physical addresses.

FIG. 8 describes a preferred embodiment of implementing step 404 of the present invention. Step 801 constructs a physical-to-real map of the memory sectors. Since at this point no new page frame is added to real memory and compression is disabled, the sectors associate with each page frame are now in a fixed position within physical memory, and their positions do not change during the computation. Constructing the physical-to-real map comprises the following steps:
1. Allocate an array of pointer A containing one entry per each physical memory sector in the allowed region. This array of pointer is allocated in the portion of physical memory with addresses higher than the threshold T defined in step 601.
2. Walk the CTT: the following pseudo code describes the operations:

```
for each CTT-entry E do:
    for each pointer P in CTT-entry E do:
        copy the index of the CTT entry into the each entry o the
    array A
        corresponding to the address stored in P.
    done
done
```

Once the physical-to-real map has been created, step 802 walks the CTT, for example, starting from the end of the CTT, and controls the execution of all the subsequent steps in the figure. One skilled in the art would appreciate that the algorithm can be easily modified to rearrange the content of the memory in order of increasing real address. While the CTT contains CTT-entries used by a page frame, steps 804 to 810 are executed. When the CTT no longer contains CTT-entries used by page frames, the method of FIG. 9 terminates at step 803.

Let E be the CTT-entry selected by step 902. E corresponds to a real address range, which contains a certain number of sectors. In a preferred embodiment, where the size of a page is 4096 bytes and the size of a memory sector is 256 bytes, the real address range corresponding to a page frame contains 4096/256=16 memory sectors.

Step 804 applies steps 805, 806 and 807 to each sector S in the physical address range equal to the real address range corresponding to E. Step 805 looks up in the physical-to-real map the real address using sector S, and retrieves the corresponding CTT-entry $E_s$. Step 806 copies the content of sector S to an unused sector S' obtained from the free-sector list. It would be apparent to one skilled in the art that steps 805 and 806 can be executed in any order. Step 807 copies the address of S' in the pointer in the CTT-entry $F_s$ that contains the address of S. When step 804 terminates the iteration, the physical address range corresponding to the real address range corresponding to the CTT-entry E can be overwritten without compromising data integrity. Step 808 iterates on the memory sectors containing the data indexed by E. Let S" denote such sector. Step 809 copies the data contained in S" to the sector having physical address equal to the real address of S".

In a preferred embodiment, the hardware and software for memory compression and morphing support a dual-addressing mode during morphing. More specifically, addresses in the morphed range (namely, addresses that already underwent the morphing process) are accessed directly through the page tables, without the further indirection of the CTT; addresses outside the morphed range (namely, addresses waiting to be morphed) are accessed through the additional indirection provided by the CTT. Preferably, once all the real pages in memory have been morphed, the morphing process is terminated by preferred steps of the physical memory occupied by the physical-to-real map is divided into page frames, which are added to the free page list; and the physical memory occupied by the CTT is divided into page frames, which are added to the free page list.

Figure 9:
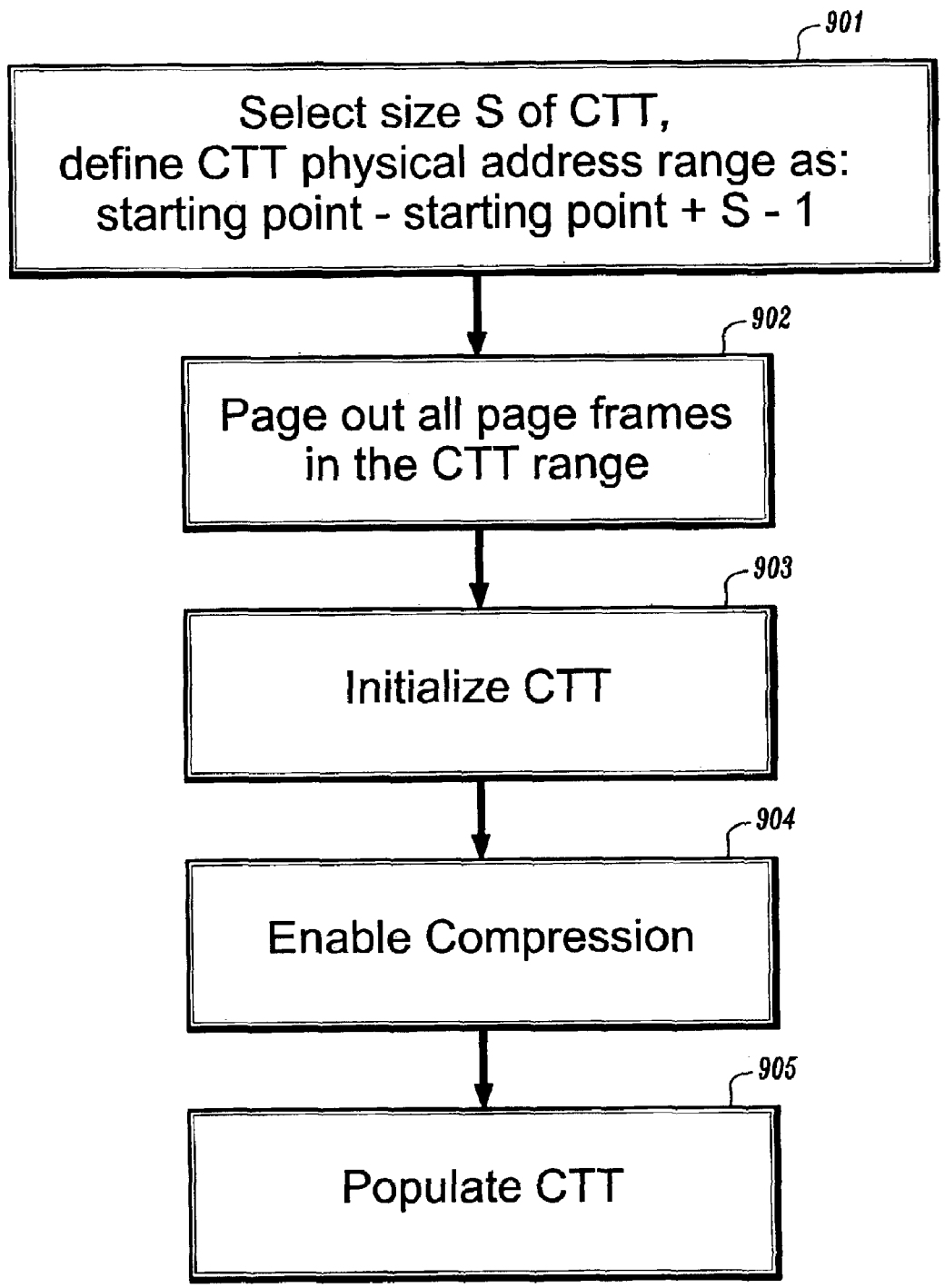
FIG. 9 shows a method for converting the content of main memory from uncompressed to compressed without interrupting the normal operation of a computer system according to a preferred embodiment of the present invention.

FIG. 9 depicts a method for reconverting the content of main memory from uncompressed to compressed without the need for interrupting the normal operation of the computer system. According to this preferred method, the operating system controls the range of non-pageable pages for a) the kernel and b) I/O operations, when the I/O buffers reside in pinned pages.

In step 901 the size of the CTT is selected. In a preferred embodiment, the size of the CTT is statically selected to equal a predefined value. In another embodiment, the compressor gathers statistics on compressibility of cache lines (but does not write compressed lines) when cache lines are written back, and the compressibility information is used to decide the size of the CTT. In a preferred embodiment, the CTT starts at a predefined address. In another embodiment, the starting address of the CTT can be selected using predefined strategies, and used as a parameter of the compressed memory management; in this embodiment, step 901 also selects a starting address of the CTT using said predefined strategies. The range of physical addresses starting at the starting address of the CTT and having length equal to the size of the CTT is called the CTT range in this invention. Step 902 pages out all page frames in the CTT range, and prevents the virtual memory manager from reusing said page frames. In a preferred embodiment, where the operating system is Windows NT, 2000, or an operating system having similar virtual memory management, Step 902 can be performed by the following examplary process:

preventing the memory manager from adding page frames in the CTT-range to the modified and standby page list, by appropriately modifying the working set manager;

analyzing the modified page, standby, free, and zero page list to identify page frames in the CTT-range;

writing said identified pages on the modified page list to the page file, and removing them from the modified page list;

removing said identified pages from the standby, free, and zero page list;

searching the page tables of the processes for page frames in the CTT-range; and writing said identified page frames to the page file, and removing them from.

The last two tasks can be accomplished by modifying the method of FIG. 7.

Step 903 initializes the CTT; step 904 enables compression and compressed memory management; and step 905 populates the CTT.

Figure 10:
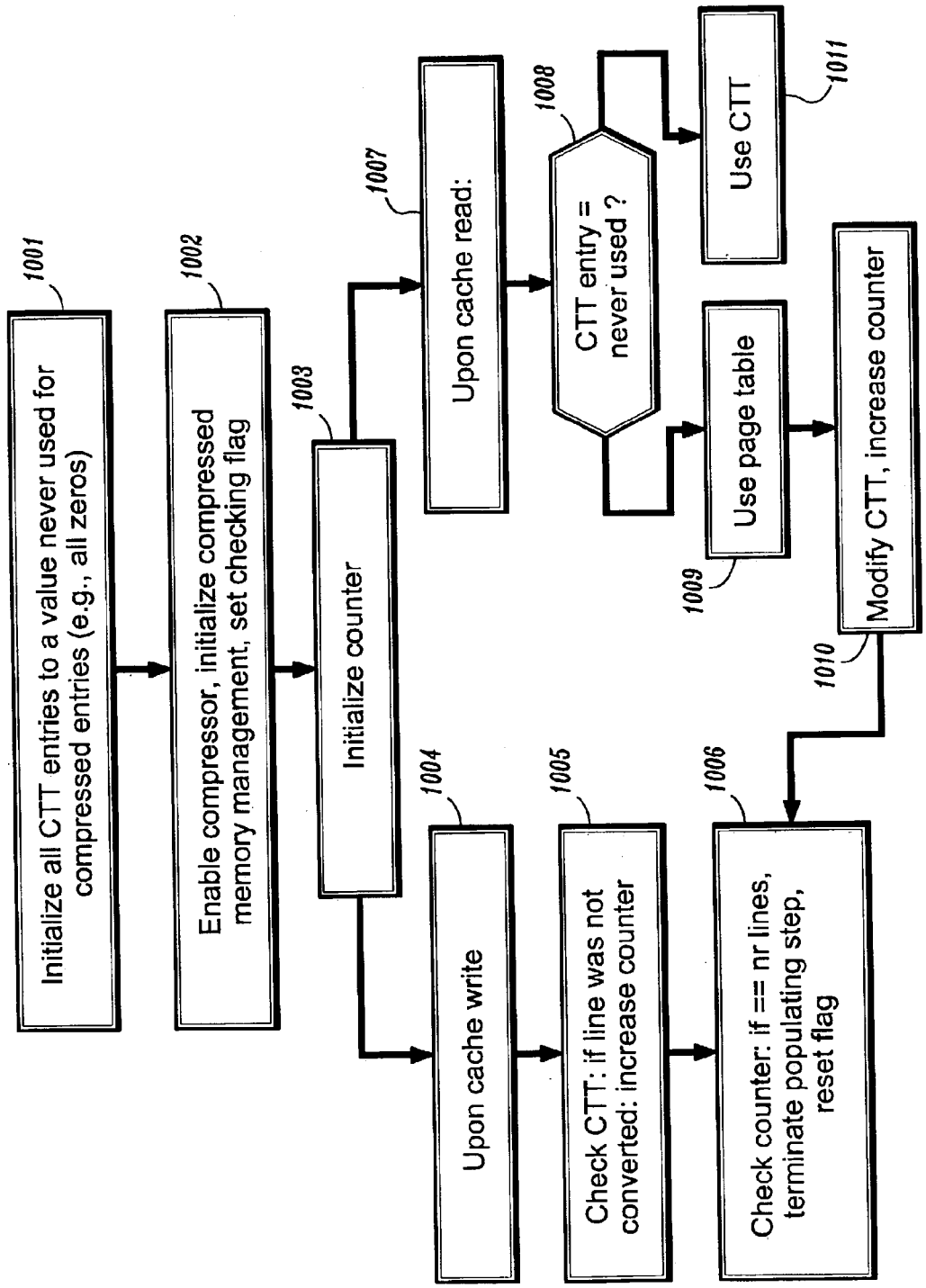
FIG. 10 shows a method for addressing the content of main memory while the content is converted from uncompressed to compressed, and details of compressing the content without interrupting the normal operation.

FIG. 10 shows a preferred embodiment. In step 1001 of performing steps 903, 904 and 905 the content of the CTT-entries are initialized to a value never used when the CTT-entry translates between real and physical addresses. By comparing the content of a CTT-entry with said value, it is therefore possible to determine if the CTT-entry is currently used for translation between real an physical addresses or if it has never been used. Step 1002 enables the compressor and initializes compressed memory management in an inverse-morphing mode, by setting a flag. Step 1003 initializes to zero the counter of the number of CTT-entries corresponding to inverse-morphed lines.

Step 1004 checks the flag upon a cache write: if the flag is set to denote inverse-morphing mode, steps 1005 and 1006 are executed. In step 1005, the compressed memory management system checks if the line being written back was converted prior to writing it back. If the line was not converted, step 1005 increases the counter, to denote that the line has now been converted. Step 1007 checks the flag upon a cache write: if the flag is set to denote inverse-morphing mode, steps 1008 is executed, which checks if the CTT-entry of the line has been modified, and the line converted. If the line has been converted, step 1011 continues the read operation by translating real addresses to physical addresses through the CTT-entry. If the line has not been converted, step 1009 continues the read operation by translating real addresses to physical addresses through the CTT-entry. To speed up the completion of inverse-morphing operations (for example, when the content of memory is mostly read and rarely written, as in data mining tasks), step 1010 modifies the CTT entry, by indicating that the line is stored uncompressed and by initializing the memory sector pointers to the physical locations of the memory sectors used by the line, and increases the counter. Step 1006 is invoked when the counter is increased, by either step 1005 or 1010. If the counter equals the number of entries in the CTT, the inverse-morphing process terminates, and the flag is reset.

Figure 11:
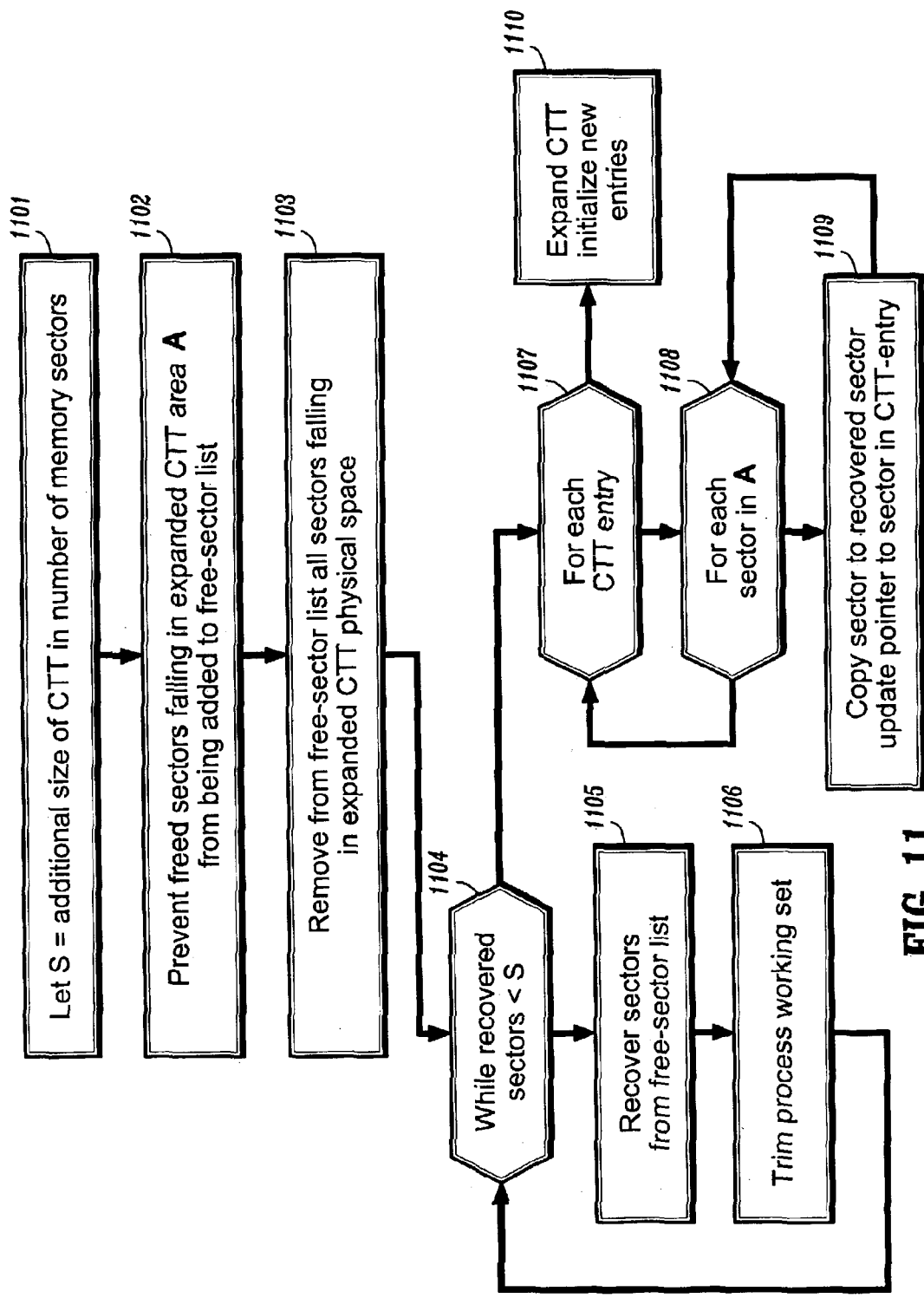
FIG. 11 shows a method for increasing the size of the memory compression directory without interrupting normal operation.

FIG. 11 shows a preferred embodiment of a method for dynamically increasing the size of the CTT. In step 1101 the additional size of the CTT is computed. It would be apparent to one skilled in the art that adaptive control strategies can be used to determine the additional size of the CTT. The symbol S is used to denote this additional size, expressed in number of memory sectors, and A to denote the interval of addresses that will be used by the CTT. Step 1102 prevents freed sectors falling in the expanded CTT area (the set of physical memory addresses A), from being added to the free-sector list. In a preferred embodiment, step 1102 notify the compressed memory management module responsible for managing the free sectors that when a memory sector is freed, its address should be examined to determine if it falls within A, and that such memory sectors should not be added to the free-sector list. Step 1103 analyzes the free-sector list and removes from it all the sectors with address in A. In a preferred embodiment, the number S is decreased by the number of memory sectors removed by step 113. Step 1104 is an iterator the purpose of which is to control steps 1105 and 1106, which together obtain S unutilized memory sectors from the free-sector list. Step 1104 terminates when S unutilized memory sectors are recovered. Step 1105 recovers sectors from the free-sector list. To avoid memory exhaustion, step 1105 always leaves a minimum number of free memory sectors on the free-sector list, as dictated by the compressed memory management policy. To allow step 1105 to gather free sectors, step 1106 forces the trimming of process working sets, which increases the size of the free-sector list. It can be readily appreciated by one skilled in the art that steps 1105 and 1106 can be executed in any order, and can also be executed concurrently. When S sectors have been retrieved from the free-sector list, step 1107 iterates on the CTT entries. Step 1107 iterates on each CTT-entry in the CTT. Step 1108 iterates on each sector pointer of the CTT-entry. If the sector is in region A, the content of the sector is copied to one of the S sectors recovered in steps 1101–1106, and the pointer is upgraded (step 1109). To prevent problems with roommates, steps 1107, 1108 and 1109 could be executed atomically on all the entries of a cohort (the set of lines that are allowed to roommate), possibly while masking interrupts. One skilled in the art, can appreciate that the set of steps 1104, 1105, 1106 and the set of steps 1107, 1108 and 1109 need not be executed sequentially, but can be executed concurrently. When all the entries in the CTT have been analyzed, step 1110 expands the CTT and initializes its entries.

Figure 12:
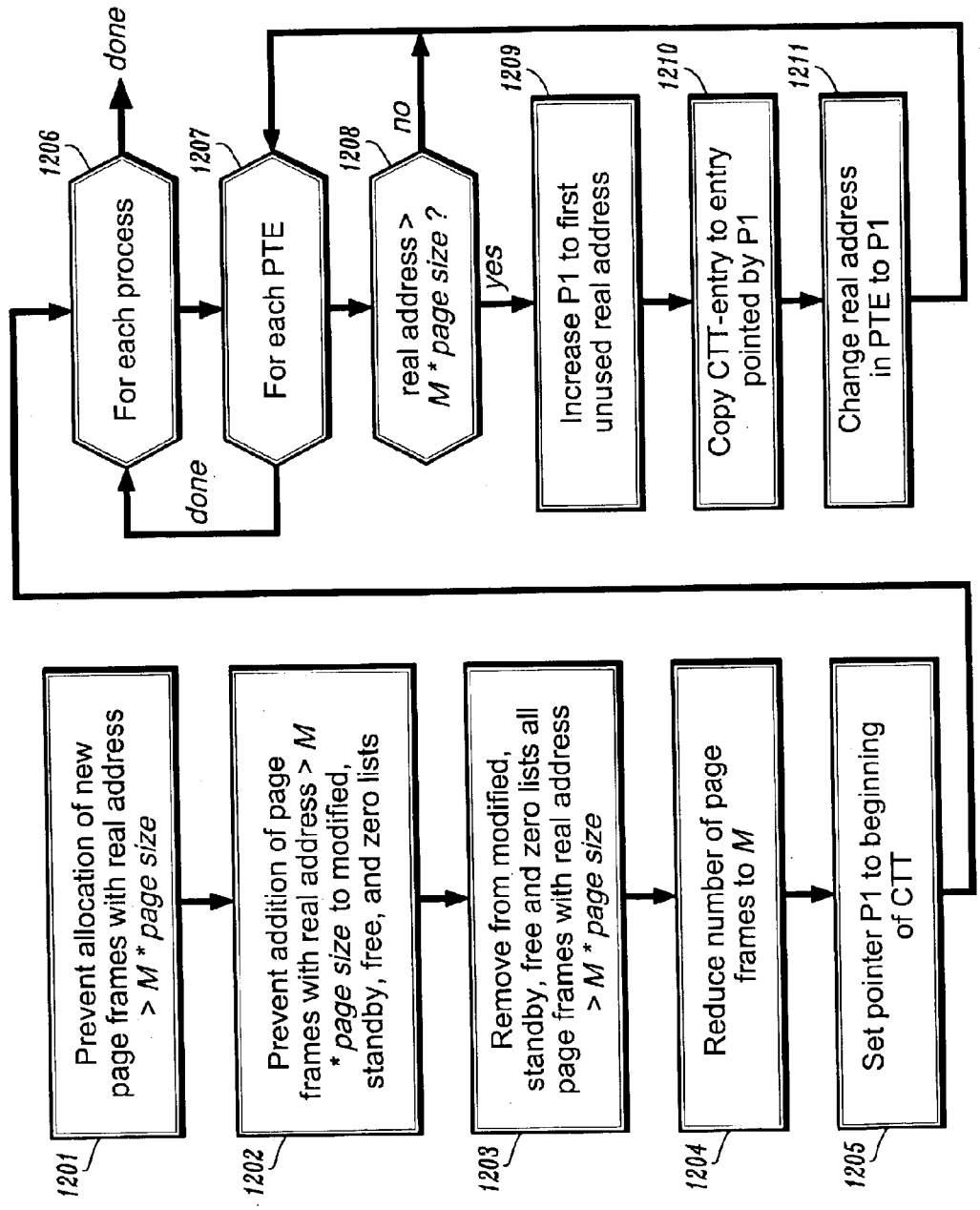
FIG. 12 shows a method for decreasing the size of the memory compression directory without interrupting normal operation.

FIG. 12 illustrates a preferred embodiment of the method for reducing the size of the compressed memory directory to the size required to index M page frames. The number M of page frames can be selected by analyzing the dynamic behavior of the compressibility of the data contained in memory. In step 1201, the compressed-memory management system is prevented from allocating novel page frames having address larger than M times the size of an uncompressed page. Step 1202 prevents the addition of page frames having real address larger than M times the size of an uncompressed page, to the modified, standby, free and zero page lists. Instead of adding such page frame to the modified list, the compressed-memory management system adds said page to the head of the modified page list, forces a page write, and discards the page frame. Instead of adding such page frame to the standby, free and zero page list, the compressed memory management system discards such page frame. Step 1203 analyzes said lists searching for page frames having real address larger than M times the size of an uncompressed page. When such page frame is found on the modified list, it is moved to the head of the list and a write-to-disk operation is issued, and the page frame is discarded. In a different embodiment, the write operation is postponed until the entire modified-page list is analyzed. When such page frame is found on the other lists, it is discarded. Step 1204 reduces the number of page frames in memory to M, for example using the method of FIG. 5. Step 1205 sets a pointer P1 to the beginning of the memory-compression directory. Step 1206 analyzes each process running on the computer system in turn. Step 1207 analyzes all the page entries of pages used by the process selected in step 1206. Step 1208 compares the real address of the page indexed by the page table entry selected in step 1207 with a threshold equal to M times the size of an uncompressed page frame. If the address is larger than said threshold, step 1209 increases the pointer P1 until it points to an unused entry in the CTT, step 1210 copies the CTT entry corresponding to the real address identified in step 1208, and step 1211 modifies said address in the page table entry selected by step 1207 to the value contained in P1. Step 1207 terminates (done in the figure) when the last PTE of the process selected by step 1206 has been analyzes, while step 1206 terminates when the last process has been analyzed. It is apparent to one ordinary skilled in the art that step 1206 need only analyze processes that had been initialized before the execution of step 1204 terminates. Also, processes that terminate before step 1206 terminates need not be analyzed, since violating page frames are managed by the compressed-memory management components initialized in steps 1201 to 1203.

FIG. 13 illustrates an embodiment of an apparatus for preventing memory-sectors falling outside the allowable region to be added to the free-sector list. In this embodiment, the allowable region includes a collection of intervals of physical addresses. This collection contains at most K intervals. Each interval is identified by its lower and upper limit. In this embodiment, the free-sector list is managed in hardware by the free-sector list management logic (1313). The part of logic 1313 which adds memory sectors to the free-sector list is enabled by signal 1314. For example, when signal is equal to 0, the logic does not add memory-sectors to the free-sector list, while when the signal is equal to 1, the logic is allowed to add memory sectors to the free-sector list. The starting address of the memory-sector to be added to the flee-sector list is stored in a register 1301. The starting address of the first interval of the allowed region is stored in register 1302, while the ending address of the first interval of the allowed region is stored in register 1303. More specifically, the ending address is the starting address of the last memory-sector belonging to the corresponding interval. In this illustrative embodiment a pair of registers is used (for starting and ending address) for each interval of the allowed region. For illustration, only the first interval and those for the last interval, interval K (i.e., registers 1307 and 1308) are shown. For each pair of registers, the logic contains a pair of comparators. The first comparator is connected to register 1301 and to the register containing the start address of the interval. For example, comparator 1304 compares the values of registers 1301 and 1302, while comparator 1309 compares the values stored in registers 1301 and 1307. This comparator outputs a "1" if the value contained in register 1301 is larger than or equal to the value contained in the other register connected to the comparator. The second comparator is connected to register 1301 and to the register containing the end address of the interval. For example, comparator 1305 compares the values of registers 1301 and 1303, while comparator 1310 compares the values stored in registers 1301 and 1308. This comparator outputs a "1" if the value contained in register 1301 is smaller than or equal to the value contained in the other register connected to the comparator. The output of the two comparators are then used as input to an AND gate. For example, the output of comparators 1304 and 1305 are used as input to AND gate 1306 and the outputs of comparators 1309 and 1310 are used as input of AND gate 1311. AND gate 1306 produces as output a "1" if both its inputs are equal to 1, and a "0" otherwise. Hence, AND gate 1306 produces a "1" if the value contained in register 1301 is larger than or equal to the value stored in register 1302 and smaller than or equal to the value stored in register 1303, namely, only if the memory-sector whose starting address is stored in 1301 falls within the interval of the allowable region defined by the starting address stored in 1302 and the ending address stored in 1303. According to this embodiment, if the number of intervals actually used by the allowable region is k, where k is smaller than the maximum value K, the AND gates of the last K-k register pairs are disabled. In a preferred embodiment, this is accomplished by adding a 1-bit flag to each register pair, which is set to 1 if the register pair corresponds to an interval of the allowable region, and to 0 other-wise; then this 1-bit flag is used as input to the AND gate, together with the outputs of the comparators. The output of all the AND gates are used as input to the OR gate 1312, which produces a "1" it at least one of its inputs is equal to "1", and a "0" otherwise. Therefore, the output 1314 of gate 1312 is equal to 1 if the memory sector whose address is stored in register 1301 belongs to one of the intervals of the allowable region.

Figure 14:
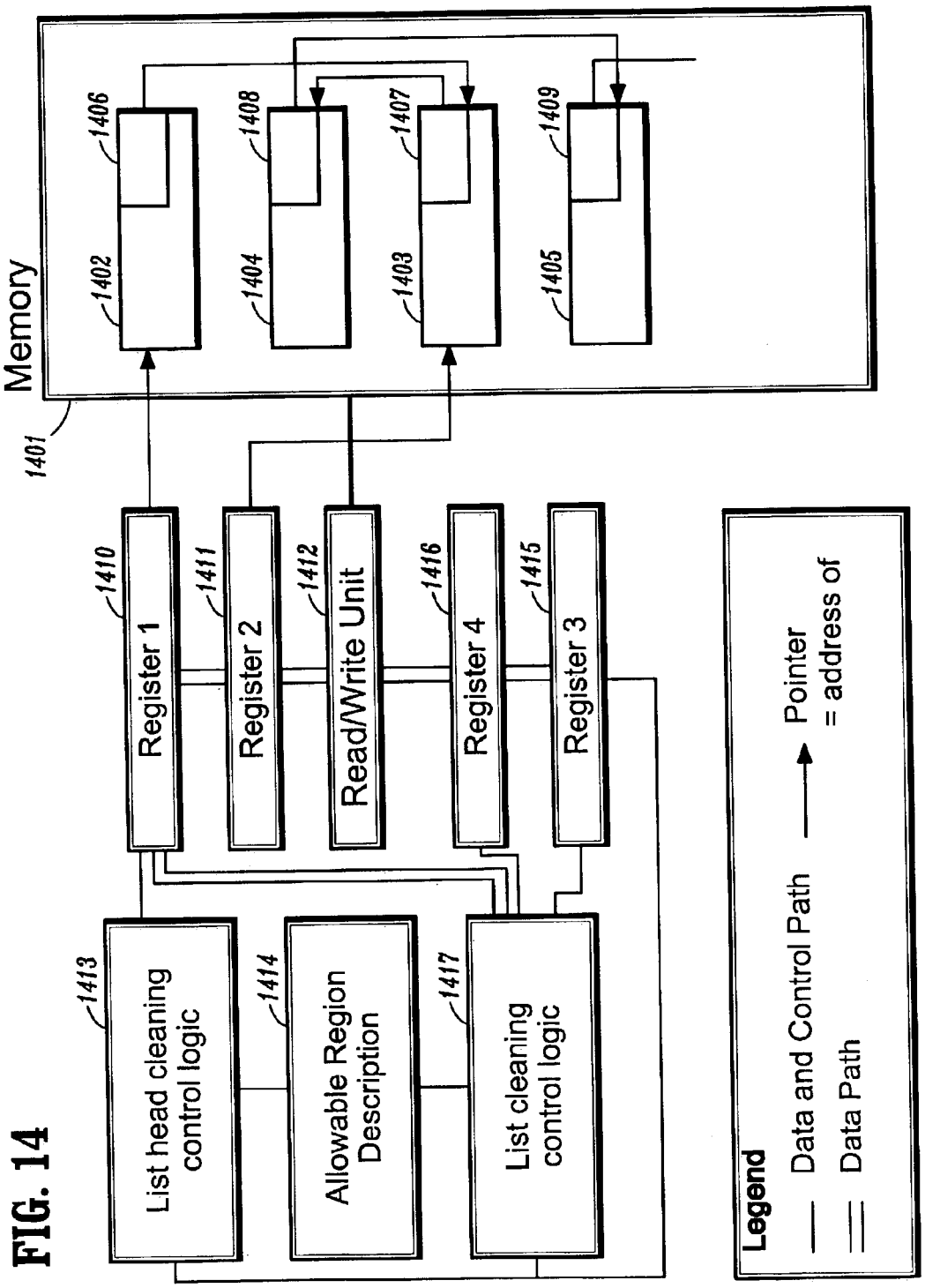
FIG. 14 shows an apparatus for removing free sector list sectors.

FIG. 14 describes an apparatus for removing firm the free-sector list sectors that lie outside the allowable region. Free memory-sectors can be located at any physical position within memory 1401, with the constraint that the address of the first byte in the memory-sector be a multiple of the memory-sector size (here, we assume for sake of discussion, that the first byte in memory has address equal to 1; if the first byte in memory has address zero, the constraint is by dividing the address of the first byte of the memory-sector modulo the size of a memory sector one obtains zero). In this embodiment, free memory-sectors are organized in a linked list, as described in the patents listed as references. Preferably, each free memory-sector contains a pointer, which contains the address of the next memory-sector in the free list. For example, the pointer could be contained in the first four bytes of the memory-sector. As shown in FIG. 14, the memory-sector 1402 is at the head of the list, and its pointer 1406 contains the address of the second memory-sector 1403. Continuing down the list, the pointer 1407 in 1403 contains the address of the third memory-sector in the list, 1404, which is followed by the fourth memory sector, 1405, and so on. The address of 1405 is stored in the pointer 1408 contained in 1404.

In this embodiment, the free-sector list is managed using 2 registers, 1410 and 1411. For a 32-bit machine, both registers are 4 bytes long, while for a 64-bit machine they would be 8 bytes long. Register 1410 contains the address of the memory-sector at the head of the free-sector list. Register 1411 contains the address of the memory-sector that immediately follows the head. When a request for a free memory sector is received, and the list is not empty, the content of register 1410 is returned. At the same time, read/write unit 1412 reads the first four bytes of the memory-sector the address of which is in register 1411. In this embodiments these four bytes contain the address of the next memory-sector on the free-sector list. One skilled in the art can appreciate how this scheme can be modified to accommodate pointers of different lengths, and having other positions within the free-sector list, and to adapt the scheme to the case where the free-sector list is managed by a data structure not resident in the free-sectors themselves. The circuit used to indicate that the free-sector list is empty, and to keep track of the number of free memory-sectors is also well known and is not shown. When the command to remove all memory sectors outside the allowable region from the free-sector list is received by the hardware, the logic 1413 is invoked. This logic performs the following operations:

1. disable allocation of free-memory sectors from the free-memory sector list.
2. compare the value of register 1410 to the description 1414 of the allowable region.
3. if the head of the list is outside the allowable region, discard the sector by copying into 1410 the value contained in 1411, invoke the operation of read/write unit 1412, go back to step 2.
4. enable allocation of free-memory sectors from the free-memory sector list, copy the value of 1410 into register 1415 and of 1411 into register 1416, and give control to list control logic 1417.

Note that disabling the allocation of free-memory sectors from the free-sector list in general would not stall the operation of the machine for a long time. The worst-case scenario occurs when all the memory-sectors outside the allowable region are on the free-sector list, and before any memory-sector inside the allowable region. Recall that only the portion of the unallowable region set aside to contain the physical-to-real map and supporting data structures is involved in this step: no free memory-sectors that overlap the CTT or data structures used by the memory compression can be on the free-memory list.

The description 1414 of the allowable region can be implemented a pair of registers or a collection of register pairs.

When 1413 gives control to the list cleaning control logic 1417, the content of register 3 is an address within the allowable region.

Logic 1417 performs the following operations:
A. compares the value of register 3 (1415) to that of register 1 (1410). If the comparison is successful, disables the allocation of free-memory sectors from the free-memory sector list, otherwise leaves allocation enabled.
B. In parallel to the previous operation, compares the value contained in register 4 (1416) with the description 1414 of the allowable region:
   If the address contained in 1416 is in the allowable region, it performs the following operations
   i. copies the value contained in 1416 into 1415
   ii. invokes the read/write unit 1412 and reads into 1416 the first four bytes of the memory-sector whose address is in 1416 during step 1 above.
   If the address contained in 1416 is not in the allowable region, then
   1. invokes the read/write unit 1412 and reads into 1416 the first four bytes of the memory-sector whose address is in 1416 during step 1 above,
   2. repeats step 1 until the content of 1416 is inside the allowable region.
   3. copies the content of register 4 (1416) into the first four bytes of the memory-sector whose address is in register 3 (1415) using read/write unit 1412
   4. if the content of register 3 (1415) equals that of register 1 (1410), copies the content of register 4 (1416) into register 2 (1411).
   5. returns to Step B.

The logic 1417 has also features for terminating appropriately the operations when the tail of the list is reached. While logic 1417 is active, register 3 always points to a memory-sector within the allowable region, while the content of register 4 changes until it equals an address within the allowable region. By copying the value of register 4 into the first 4 bytes of the sector whose address is in 1415, the logic "detaches" from the free-sector list those memory-sectors lying outside the allowable region. By disallowing giving out free-sectors while the content of 1415 equals that of 1410, the changes to the circuit for controlling the operations on the head of the free-sector list is minimized.

Preferred embodiments of the present invention are described based a paged operating system, such as Windows95, Windows98, WindowsNT, Windows2000, Linux, AIX and all the other versions of UNIX, MacOS, IBM OS/400 etc. One of ordinary skill in the art readily appreciates that non-paged operating systems are equally applicable to the embodiments of the present invention.

While the invention has been shown and described with reference to certain preferred embodiments thereof, it will be understood by those skilled in the art that various changes in form and detail may be made therein without departing from the spirit and scope of the invention as defined by the appended claims.

What is claimed is:

1. In a computer system having a main memory for storing data in a compressed format and a processor cache for storing decompressed data, a method for converting the data of said main memory from compressed to uncompressed state, comprising the steps of:
   reducing used portions of said main memory to a target value;
   disabling a compressor used for compressing the uncompressed data;
   decompressing said compressed data of said main memory;
   moving said decompressed data to physical addresses equal to real addresses; and
   releasing the memory occupied by a compressed memory director and data structures used in the above steps.

2. The method of claim 1, wherein the step of reducing used portions of said compressed main memory comprises reducing the number of page frames in said main memory to a number lower than a threshold, wherein said threshold multiplied by the size of a page equals a target value.

3. The method of claim 2, wherein the step of reducing the number of page frames in said main memory to a number lower than said threshold further comprises the steps of:

disabling adding new page frames to real memory space;

removing all page frames from a zero list;

pruning pages from a working set of processes using said main memory; and removing said pruned pages from said zero list.

4. The method of claim 2, wherein said threshold for the number of page frames in said main memory is not larger than the size of a physical memory minus the size of said compressed memory directory minus the size of said data structures.

5. The method of claim 1, further including dividing said main memory into memory sectors and managing unused memory sections using a free-sector list, and wherein the step of decompressing said compressed data of said main memory comprises the steps of:

defining an allowable region of real addresses;

removing from the free-sector list sectors having physical addresses outside the allowable region;

changing real addresses outside the allowable region to real addresses inside the allowable region; and decompressing compressed memory lines representing units of compression/decompression.

6. The method of claim 5, wherein the step of defining an allowable region comprises the steps of defining a threshold; and equalizing the allowable region to the set of real addresses below said threshold, minus the physical addresses used by said compressed memory directory.

7. The method of claim 6, wherein said threshold is larger than said target value of used portions of said main memory, plus the size of said compressed memory directory.

8. The method of claim 6, wherein said threshold is smaller than the physical size of said main memory minus the size of data structures used by morphing.

9. The method of claim 5, further including managing paged virtual memory by an operating system; and wherein said step of decompressing all compressed memory lines, performed on the memory used by each process, comprises the steps of:

obtaining page tables of said process;

for each page table entry in said page tables of said process corresponding to a page contained in said main memory, applying the steps of:

reading into cache all memory lines of said page, and writing back the content of said memory line into said main memory.

10. The method of claim 5, further including managing paged virtual memory by an operating system and wherein said step of changing real addresses outside the allowable region to real addresses inside the allowable region, performed on the memory used by each process comprises the steps of:

obtaining the page tables of said process;

for each page table entry in said page tables of said process corresponding to a page contained in said main memory, applying the steps of:

checking whether the address of said page is outside the allowable region, and changing the address of said page outside the allowable region to an address within the allowable region.

11. The method of claim 10, further comprising the steps of:

initializing a pointer to the first entry of said compressed memory directory;

advancing said pointer to the first unused entry of said compressed memory directory corresponding to a real address within said allowable region;

changing said address of said page outside the allowable region to the address contained in said pointer; and advancing said pointer to the next unused entry of said compressed memory directory corresponding to a real address within said allowable region.

12. The method of claim 1, wherein moving said memory content to physical addresses equal to real addresses comprises the steps of:

creating a physical-to-real address map; and for each memory line indexed in said compressed memory directory, moving said memory line to a physical address equal to its real address.

13. The method of claim 12, wherein moving said memory line to a physical address equal to its real address comprises the steps of:

finding the compressed memory directory entries of the memory sectors occupying the physical addresses equal to the real addresses of the memory sectors of said memory line;

copying the content of the memory sectors having physical address equal to the real addresses of the memory sectors of said memory line to unused memory sectors;

updating the compressed memory directory entries of said copied memory sectors to contain the new physical memory addresses of said memory sectors;

updating the physical-to-real map with the new locations of said copied memory sectors;

copying the content of said physical memory sectors of said memory line to the memory sectors having physical address equal to their real address;

updating the physical-to-real map with the new locations of said copied memory sectors; and removing from the physical-to-real map the old locations of said copied memory sectors.

14. In a computer system in which main memory contents can be maintained in a compressed format and in uncompressed format, a method for converting an operating mode from an uncompressed mode to a compressed mode, not requiring stopping and restarting said computer system, comprising the steps of:

selecting a size for a compressed memory directory;

removing a content of a portion of said main memory selected to contain said compressed memory directory;

initializing said compressed memory directory, and enabling compressed-main memory mode.

15. The method of claim 14, further comprising the step of selecting a starting location for the compressed memory directory.

16. The method of claim 14, wherein removing the content of the portion of said main memory selected to contain said compressed memory directory comprises the steps of:

preventing the virtual memory manager from allocating to processes parts of said portion of said main memory selected to contain said compressed memory directory;

identifying parts of said portion of said main memory selected to contain said compressed memory directory, that are used by said virtual memory manager and not by processes;

writing to tertiary store said identified pans of memory that are modified, and disallowing their use by the virtual memory manager; and disallowing the use by the virtual memory manager of said identified parts of memory that are not modified.

17. The method of claim 14, wherein removing the content of the portion of said main memory selected to contain said compressed memory directory further comprises the step of:

analyzing the memory used by processes;

identifying in said memory used by processes parts of said portion of said main memory selected to contain said compressed memory directory;

writing to tertiary store said parts said identified parts of memory that are modified, and disallowing their use by the virtual memory manager; and disallowing the use by the virtual memory manager of said identified parts of memory that are not modified.

18. The method of claim 14, wherein said portion of said main memory selected to contain said compressed memory directory are page frames.

19. The method of claim 14, further comprising the step of populating said compressed memory directory.

20. The method of claim 19, wherein enabling initializing said compressed memory directory, enabling compression and populating said compressed memory directory comprise the steps of:

initializing all the entries of said compressed memory directory to a value not used to denote compressed entries;

enabling the compressor, initializing compressed memory management in an inverse-morphing mode; and operating the compressed memory management in said inverse-morphing mode until the entire content of memory is inverse-morphed.

21. The method of claim 20, wherein the running the compressed memory management in said inverse-morphing mode comprises the steps of:

setting a checking flag for control line the cache read/write operation;

initializing a counter of morphed memory lines to zero;

upon a cache write, checking if the memory line was not inverse-morphed by comparing the compressed memory directory entry value to the value not used to compressed entry and increasing the counter if said compared values are equal;

upon a cache read, checking if the memory line was not inverse-morphed by comparing the compressed memory directory entry value to the value not used to compressed entry and using the CTT-entry to perform real-to-physical translation if said compared values are not equal;

upon a cache read, checking if the CTT line was not inverse-morphed by comparing the compressed memory directory entry value to the value not used to compressed entry, and using the page table real-to-physical translation, modifying the CTT-entry and increasing said counter, if said compared values are not equal; and when said counter is increased, comparing the value of the counter to the number of entries in said compressed memory directory, and resetting said flag, and terminating inversed-morphing mode if said compared values are equal.

22. In a computer system having a main memory for maintaining contents in a compressed format and a compressed memory directory, a method for increasing a size of the compressed-memory directory while not requiring stopping and restarting said computer system, comprising the steps of:

selecting a new size for the compressed memory directory;

removing a content of a portion of said main memory selected to contain an additional portion of said compressed memory directory; and initializing the additional portion of said compressed-memory directory.

23. The method of claim 22, wherein removing the content of the portion of said main memory selected to contain the additional portion of said compressed memory directory comprises the steps of:

preventing free memory sectors falling in said portion of main memory from being added to the free-sector list;

removing memory sectors belonging to said portion of main memory from the free-sector list; and copying used memory sectors to said portion of main memory to unused memory sectors.

24. A readable device for storing codes executable by a processor in a computer system for performing a method for decreasing a size of compressed-memory directory of a compressed contents in a main memory in the computer system, the method comprising the steps of:

selecting a new size for the compressed memory directory to contain entries for M page frames;

reducing the number of page frames to said value M; and changing the address of page frames having addresses outside the range addressable by said compressed-memory directory with said selected new size, to address within said addressable range.

25. The method of claim 24, wherein reducing the number of page frames comprises the steps of:

preventing allocation of new page frames having real address larger than said value M multiplied by the page frame size;

preventing the addition of page frames having real address outside said address range addressable by said compressed-memory directory with said selected new size to data structures used to reassign released page frames;

removing from said data structures used to reassign released page frames all page frames having real address outside said address range addressable by said compressed-memory directory with said selected new size; and reducing the number of page frames to M by pruning the working sets of processes.

26. The method of claim 25, wherein said data structures used to reassign released page frames include one of a modified-page standby list, free-page list, and zero page list.

27. The method of claim 24, wherein changing the address of page frames having addresses outside the range addressable by said compressed-memory directory with said new size comprises the steps of:

searching the page tables of processes for page frames having addresses outside said addressable range;

searching said compressed-memory directory for free entries corresponding to said new addressable range;

modifying the real address in said page table entry to refer to said free entry; and copying the compressed memory directory entry of said page frame having address outside said addressable range to said free entry.

28. In a computer system having a main memory for storing data in a compressed format and a processor cache for strong decompressed data, a method for converting the data of said main memory from compressed to uncompressed state, comprising the steps of:

(a) reducing used portions of said main memory to a target value;

(b) disabling a compressor used for compressing the uncompressed data;

(c) decompressing said compressed data of said main memory;

(d) moving said decompressed data to physical addresses equal to real addresses; and (e) releasing the memory occupied by a compressed memory director and data structures used in steps a. to d.

* * * * *